United States Patent
Tanzawa

(10) Patent No.: US 8,619,471 B2
(45) Date of Patent: Dec. 31, 2013

(54) APPARATUSES AND METHODS INCLUDING MEMORY ARRAY DATA LINE SELECTION

(75) Inventor: Toru Tanzawa, Tokyo (JP)

(73) Assignee: Micron Technology, Inc., Boise, ID (US)

(*) Notice: Subject to any disclaimer, the term of this patent is extended or adjusted under 35 U.S.C. 154(b) by 217 days.

(21) Appl. No.: 13/192,280

(22) Filed: Jul. 27, 2011

(65) Prior Publication Data

US 2013/0028024 A1 Jan. 31, 2013

(51) Int. Cl.
*G11C 16/00* (2006.01)

(52) U.S. Cl.
USPC ............ 365/185.18; 365/185.17; 365/185.23; 365/189.02

(58) Field of Classification Search
USPC .......................................................... 365/130
See application file for complete search history.

(56) References Cited

U.S. PATENT DOCUMENTS

| | | | |
|---|---|---|---|
| 4,980,861 A * | 12/1990 | Herdt et al. | 365/185.17 |
| 5,204,839 A * | 4/1993 | Lee et al. | 365/204 |
| 6,118,714 A | 9/2000 | Ienaga | |
| 6,477,083 B1 | 11/2002 | Fastow et al. | |
| 7,046,549 B2 | 5/2006 | Lee et al. | |
| 7,057,915 B2 | 6/2006 | Futatsuyama | |
| 7,339,820 B2 | 3/2008 | Kato | |
| 7,583,533 B2 | 9/2009 | Kutsukake et al. | |
| 2006/0133139 A1 | 6/2006 | Sakurai et al. | |
| 2009/0262568 A1 | 10/2009 | Ono | |

FOREIGN PATENT DOCUMENTS

WO    WO-2013016495 A1    1/2013

OTHER PUBLICATIONS

Tanaka, T., et al., "A quick intelligent page-programming architecture and a shielded bitline sensing method for 3 V-only NAND flash memory", IEEE Journal of Solid-State Circuits, 29(11), (Nov. 1994), 1366-1373.
"International Application No. PCT/US2012/048264, International Search Report mailed Dec. 20, 2012", 3 pgs.
"International Application No. PCT/US2012/048264, Written Opinion mailed Dec. 20, 2012", 5 pgs.

* cited by examiner

*Primary Examiner* — Tan T. Nguyen
(74) *Attorney, Agent, or Firm* — Schwegman, Lundberg & Woessner, P.A.

(57) ABSTRACT

Some embodiments include an apparatus having data lines coupled to memory cell strings and a selector configured to selectively couple one of the data lines to a node. The memory cell strings and the selector can be formed in the same memory array of the apparatus. Other embodiments including additional apparatus and methods are described.

46 Claims, 31 Drawing Sheets

US 8,619,471 B2

APPARATUSES AND METHODS INCLUDING MEMORY ARRAY DATA LINE SELECTION

BACKGROUND

Memory devices, such as flash memory, are widely used in computers and many electronic products. Such memory devices usually have a memory array with numerous memory cells to store information. These memory devices also have circuitry to transfer information to and from the memory array. Information can be stored into the memory cells in a programming operation. The stored information can be retrieved in a read operation or can be cleared in an erase operation. As memory cell density increases for a given device area, designing circuitry associated with a memory array in these devices may pose a challenge.

DETAILED DESCRIPTION

Figure 1:
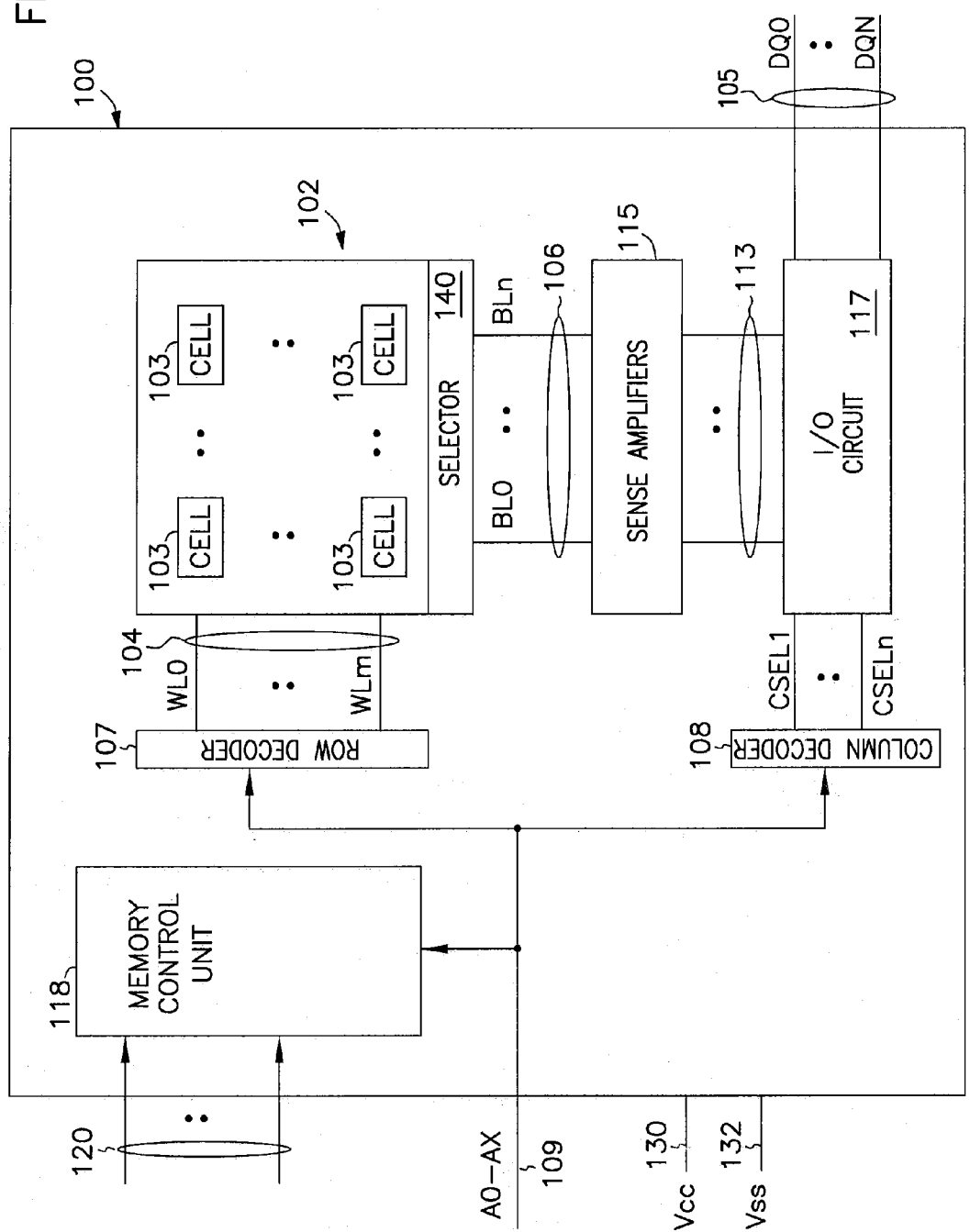
FIG. 1 shows a block diagram of a memory device having a memory array with memory cells, according to an embodiment of the invention.

FIG. 1 shows a block diagram of an apparatus in the form of a memory device 100, having a memory array 102 with memory cells 103, according to an embodiment of the invention. Memory cells 103 can be arranged in rows and columns along with lines 104 and lines 106. Lines 104 can carry signals WL0 through WLm and can form part of access (e.g., word) lines of memory device 100. Lines 106 can carry signals BL0 through BLn and can form part of data lines (e.g., bit lines) of memory device 100.

Memory device 100 may use lines 104 to access memory cells 103 and lines 106 to exchange information (e.g., provide signals) with memory cells 103. A row decoder 107 and a column decoder 108 decode address signals A0 through AX on lines 109 (e.g., address lines) to determine which memory cells 103 are to be accessed in a memory operation.

Memory device 100 can perform memory operations such as a read operation to read information from memory cells 103 and a write (e.g., programming) operation to write (e.g., program) information into memory cells 103. Memory device 100 can also perform an erase operation to clear information from some or all of memory cells 103.

A memory control unit 118 controls memory operations of memory device 100 based on control signals on lines 120. Examples of the control signals on lines 120 include one or more clock signals and other signals to indicate which operation (e.g., read, programming, or erase operation) memory device 100 can perform.

Other devices external to memory device 100 (e.g., a memory access device, such as a processor or a memory controller) can control the values of the control signals on lines 120. Specific values of a combination of the signals on lines 120 can produce a command (e.g., read, programming, or erase command) that can cause memory device 100 to perform a corresponding memory operation (e.g., read, programming, or erase operation).

Memory device 100 can include a selector 140 configured to selectively couple memory cells 103 associated with lines 106 to sense circuits, such as sense amplifiers 115, in a memory operation, such as a read operation. Selector 140 and memory cells 103 can be physically located in the same memory array 102. A portion of memory array 102 can form memory cells 103 to store information. Another portion of memory array 102 can form selector 140.

Sense amplifiers 115 are configured to determine the value of information from memory cells 103 in a memory operation, such as a read operation, and provides the information in the form of signals to lines 113 (e.g., data lines). Sense amplifiers 115 can also use the signals on lines 113 to determine the value of information to be written (e.g., programmed) into memory cells 103.

Memory device 100 can include an input/output (I/O) circuit 117 to exchange information between memory array 102 and lines (e.g., I/O lines) 105. Signals DQ0 through DQN on lines 105 can represent information read from or to be written into memory cells 103. Lines 105 can include nodes within memory device 100 or pins (or solder balls) on a package where memory device 100 can reside. Other devices external to memory device 100 (e.g., a memory controller or a processor) can communicate with memory device 100 through lines 105, 109, and 120.

I/O circuit 117 can respond to signals cSEL1 through cSELn to select the signals on lines 113 that can represent the information read from or programmed into memory cells 103. Column decoder 108 can selectively activate the CSEL1 through CSELn signals based on the A0 through AX address signals on lines 109. I/O circuit 117 can select the signals on lines 113 to exchange information between memory array 102 and lines 105 during read and programming operations.

Each of memory cells 103 can be programmed to store information representing a value of a fraction of a bit, a value of a single bit or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value representing multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Memory device 100 can include a non-volatile memory device and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the embodiments described herein.

Memory device 100 may include memory devices and operate using memory operations (e.g., read, programming, and erase operations) similar to or identical to memory devices and operations described below with reference to FIG. 2 through FIG. 29.

Figure 2:
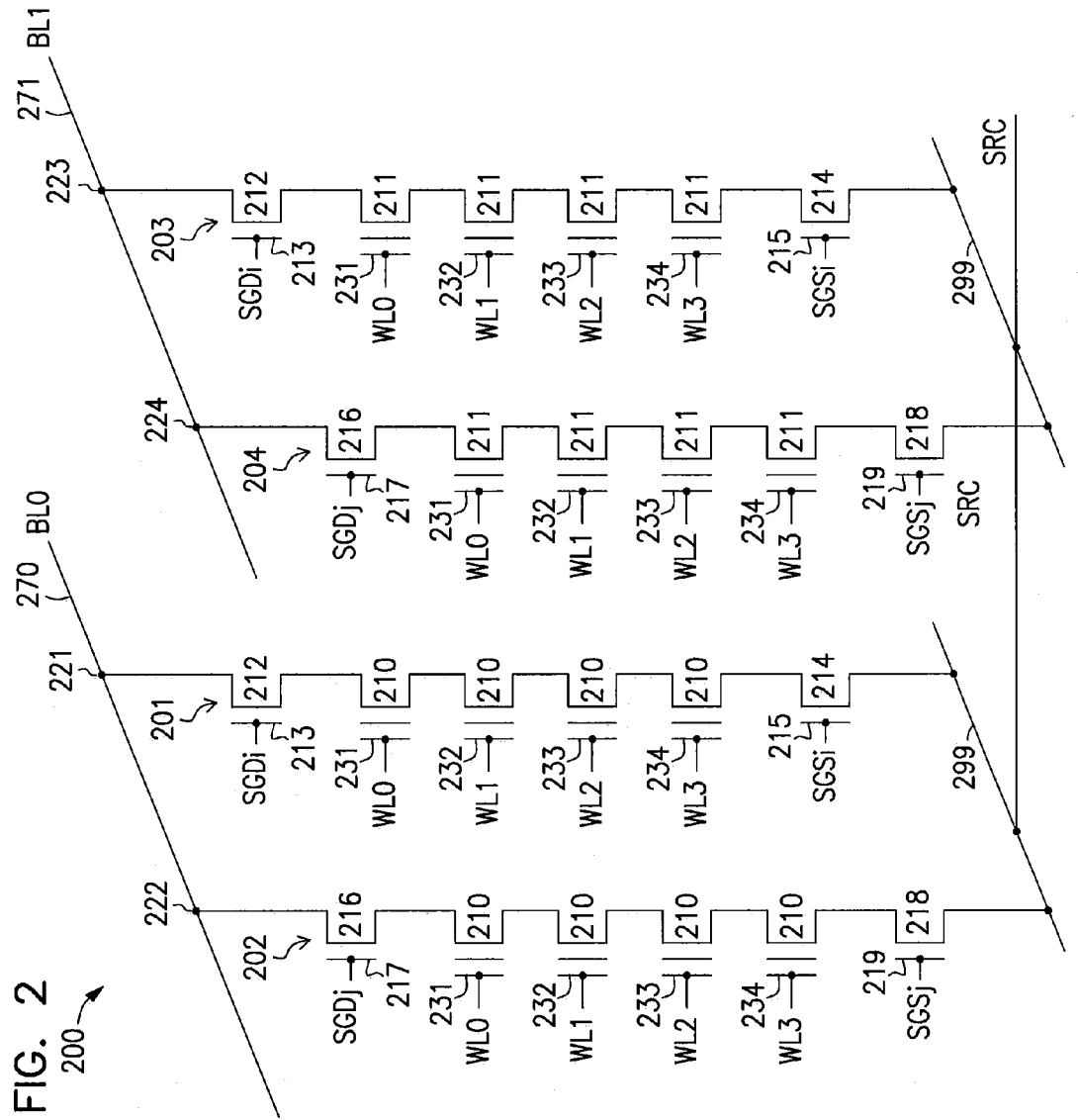
FIG. 2 shows a schematic diagram of a portion of a memory device including memory cell strings, according to an embodiment of the invention.

FIG. 2 shows a schematic diagram of a portion of a memory device 200 including memory cell strings 201, 202, 203, and 204, according to an embodiment of the invention. Memory device 200 can be associated with memory device 100 of FIG. 1, such as forming a portion of memory array 102 of memory device 100.

As shown in FIG. 2, memory cell strings 201 and 202 can be coupled to line 270 at nodes 221 and 222, respectively. Memory cell strings 203 and 204 can be coupled to line 271 at nodes 223 and 224, respectively. Each of memory cell strings 201, 202, 203, and 204 can also be coupled to line 299, which can be coupled to a line associated with a signal SRC.

Lines 270 and 271 can be structured as conductive lines and can form part of data lines (e.g., bit lines) of memory device 200 to carry signals BL0 and BL1, respectively. Line 299 can be structured as a conductive line and can form a part of a source line of memory device 200 that carries signal SRC.

As shown in FIG. 2, memory cell string 201 can include memory cells 210 with associated gates 231, 232, 233, and 234, and transistors 212 and 214 with associated gates 213 and 215. Memory cell string 202 can include memory cells 210 with associated gates 231, 232, 233, and 234, and transistors 216 and 218 with associated gates 217 and 219. Memory cell string 203 can include memory cells 211 with associated gates 231, 232, 233, and 234, and transistors 212 and 214 with associated gates 213 and 215. Memory cell string 204 can include memory cells 211 with associated gates 231, 232, 233, and 234, and transistors 216 and 218 with associated gates 217 and 219.

The memory cells (210 or 211) in each of memory cell strings 201, 202, 203, and 204 can be stacked over each other in multiple levels of memory device 200 over a substrate (e.g., a semiconductor substrate) of memory device 200.

Gates 213 of memory cell strings 201 and 203 can be coupled together to carry the same signal SGDi. Gates 217 of memory cell strings 202 and 204 can be coupled together to carry the same signal SGDj. Signals SGDi and SGDj can be two different signals.

Gates 215 of memory cell strings 201 and 203 can be coupled together to carry the same signal SGSi. Gates 219 of memory cell strings 202 and 204 can be coupled together to carry the same signal SGSj. Signals SGSi and SGSj can be two different signals.

Gates 231 of memory cell strings 201, 202, 203, and 204 can be coupled together to carry the same signal WL0. Gates 232 of memory cell strings 201, 202, 203, and 204 can be coupled together to carry the same signal WL1. Gates 233 of memory cell strings 201, 202, 203, and 204 can be coupled together to carry the same signal WL2. Gates 234 of memory cell strings 201, 202, 203, and 204 can be coupled together to carry the same signal WL3.

FIG. 2 shows an example of two lines (e.g., 270 and 271) and two memory cell strings coupled to each line with each string having four memory cells. The number of lines, memory cell strings, and memory cells in each memory cell strings may vary.

Memory device 200 may include memory devices and operate using memory operations (e.g., read, programming, and erase operations) similar to or identical to memory devices and operations described below with reference to FIG. 3 through FIG. 29.

Figure 3:
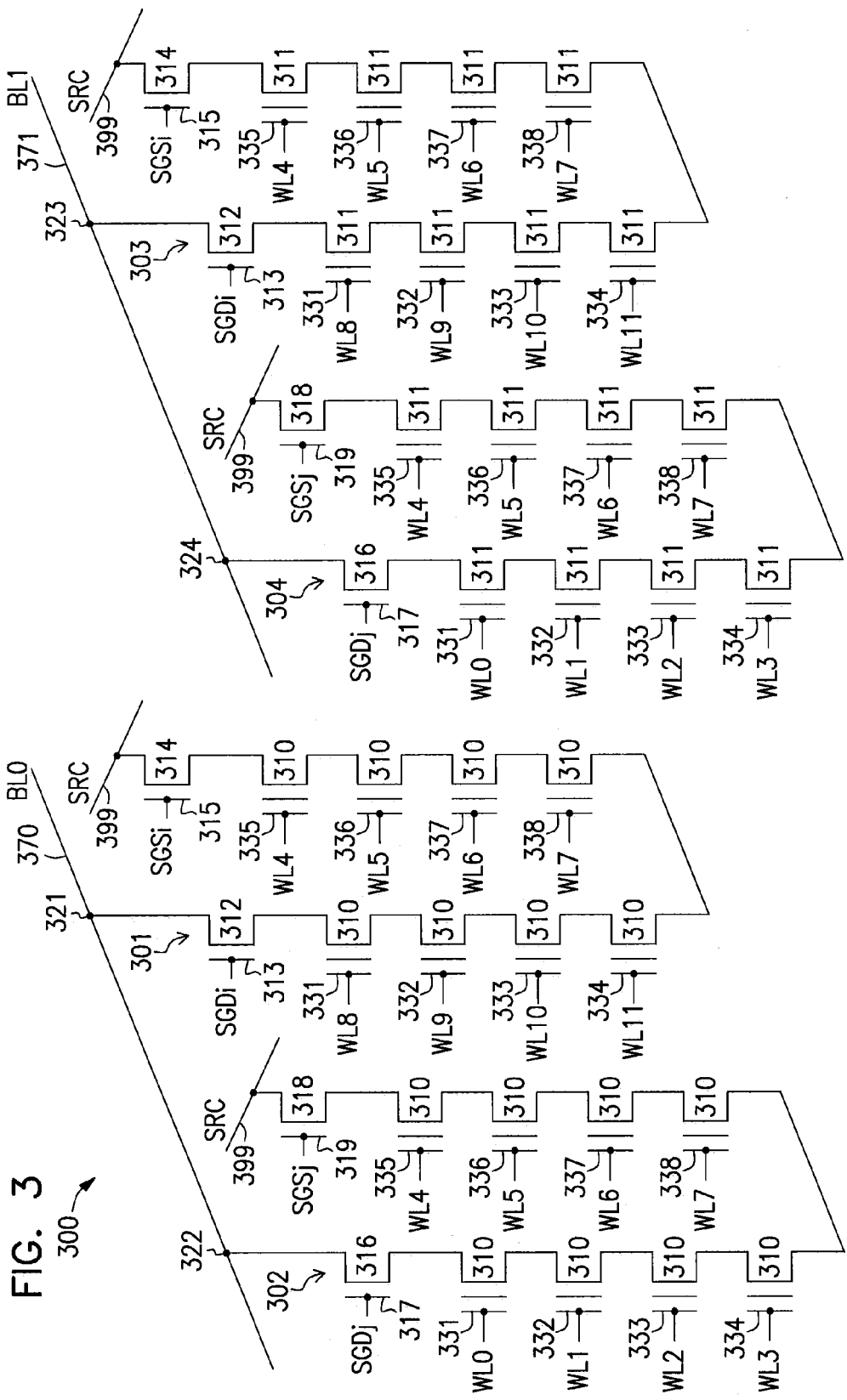
FIG. 3 shows a schematic diagram of a portion of memory device including memory cell strings having a U-shape, according to an embodiment of the invention.

FIG. 3 shows a schematic diagram of a portion of memory device 300 including memory cell strings 301, 302, 303, and 304 having a U-shape, according to an embodiment of the invention. Memory device 300 can be associated with memory device 100 of FIG. 1, such as forming a portion of memory array 102 of memory device 100.

As shown in FIG. 3, memory cell strings 301 and 302 can be coupled to line 370 at nodes 321 and 322, respectively. Memory cell strings 303 and 304 can be coupled to line 371 at nodes 323 and 324, respectively.

Lines 370 and 371 can include conductive lines and can form part of data lines (e.g., bit lines) of memory device 300 to carry signals BL0 and BL1, respectively. Line 399 includes a conductive line and can form a part of a source line of memory device 300 that carries a signal SRC (e.g., source line signal).

As shown in FIG. 3, memory cell string 301 can include memory cells 310 with associated gates 331, 332, 333, 334, 335, 336, 337, and 338, and transistors 312 and 314 with associated gates 313 and 315. Memory cell string 302 can include memory cells 310 with associated gates 331 through 338, and transistors 316 and 318 with associated gates 317 and 319. Memory cell string 303 can include memory cells 311 with associated gates 331, 332, 333, 334, 335, 336, 337, and 338, and transistors 312 and 314 with associated gates 313 and 315. Memory cell string 304 can include memory cells 311 with associated gates 331 through 338, and transistors 316 and 318 with associated gates 317 and 319.

The memory cells (310 or 311) in each of memory cell strings 301, 302, 303, and 304 can be stacked over each other in multiple levels of memory device 300 over a substrate (e.g., a semiconductor substrate) of memory device 300.

Gates 313 of memory cell strings 301 and 303 can be coupled together to carry the same signal SGDi. Gates 317 of memory cell strings 302 and 304 can be coupled together to carry the same signal SGDj. Signals SGDi and SGDj can be two different signals.

Gates 315 of memory cell strings 301 and 303 can be coupled together to carry the same signal SGSi. Gates 319 of memory cell strings 302 and 304 can be coupled together to carry the same signal SGSj. Signals SGSi and SGSj can be two different signals.

In memory cell string 301, gates 331, 332, 333, 334, 335, 336, 337, and 338 are associated with signals WL0, WL1, WL2, WL3, WL4, WL5, WL6, WL7, respectively. In memory cell string 302, gates 331, 332, 333, 334, 335, 336, 337, and 338 are associated with signals WL8, WL9, WL10, WL11, WL4, WL5, WL6, and WL7, respectively. The gates associated with the same signal can be coupled to each other. For example, the gates with signals WL0, WL1, WL2, and WL3 can be coupled together. The gates with signals WL4, WL5, WL6, and WL7 can be coupled together. The gates with signals WL8, WL9, WL10, and WL11, can be coupled together.

FIG. 3 shows an example of two lines (e.g., 370 and 371) and two memory cell strings in each line with each string having eight memory cells. The number of lines, memory cell strings, and memory cells in each memory cell strings may vary.

Memory device 300 may include memory devices and operate using memory operations similar to or identical to memory devices and operations described below with reference to FIG. 4 through FIG. 29.

Figure 4:
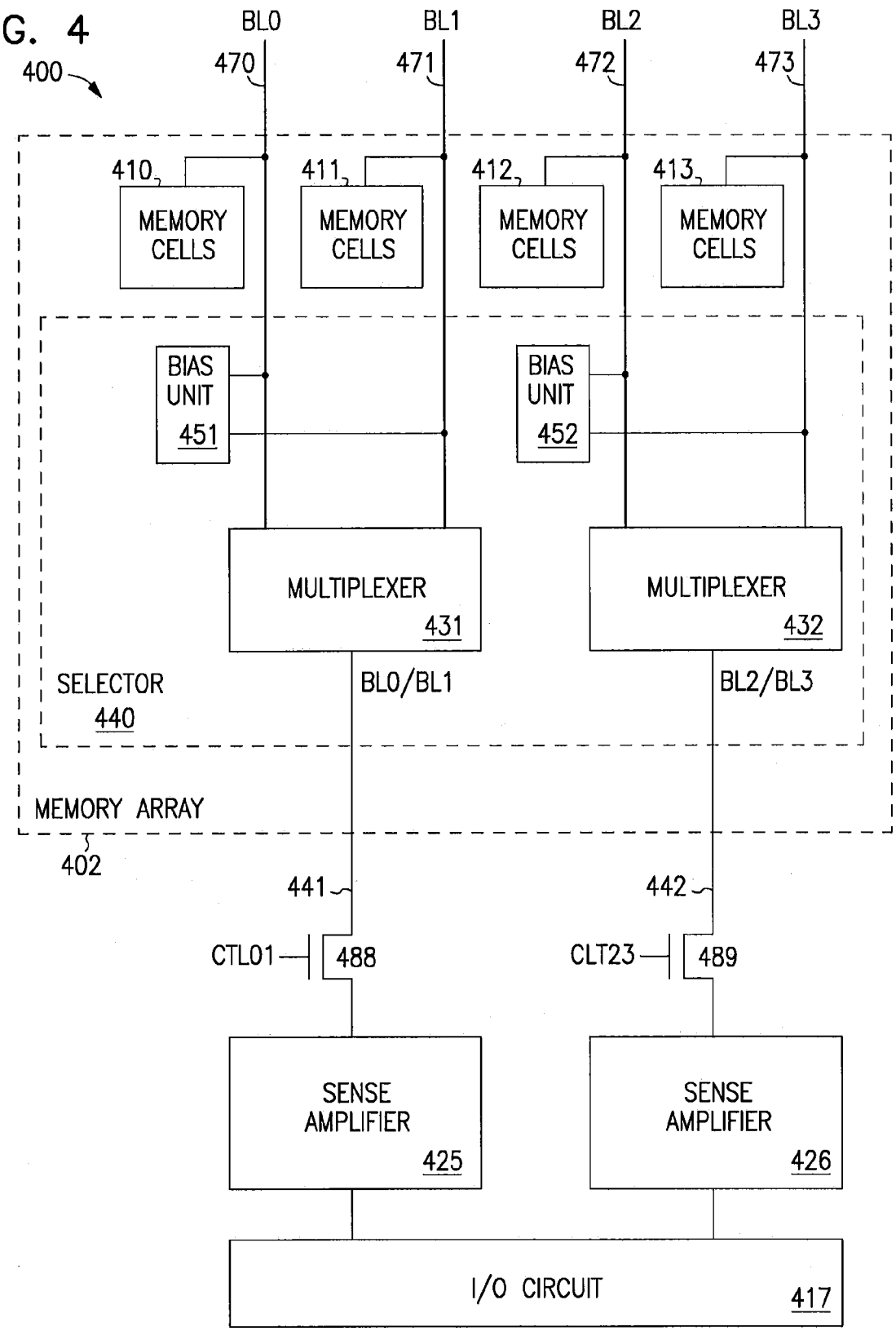
FIG. 4 shows a block diagram of a portion of a memory device including a memory array, according to an embodiment of the invention.

FIG. 4 shows a block diagram of a portion of a memory device 400 including a memory array 402, according to an embodiment of the invention. Memory device 400 can be associated with memory device 100 of FIG. 1, such as forming a portion of memory array 102 including memory cells 103 and selector 140.

As shown in FIG. 4, memory array 402 can include groups of memory cells 410, 411, 412, and 413, and a selector 440. Each memory cell of the groups of memory cells 410, 411, 412, and 413 can be arranged in memory cell strings. For example, each of memory cells 410, 411, 412, and 413 can include memory cell strings such as memory cell strings 201, 202, 203, and 204 of FIG. 2. In another example, each of memory cells 410, 411, 412, and 413 can include memory cell strings such as memory cell strings 301, 302, 303, and 304 of FIG. 3.

Memory device 400 can include lines 470, 471, 472, and 473, which can be data lines of memory device 400, to carry signals BL0, BL1, BL2, and BL3, respectively. Lines 470, 471, 472, and 473 can be arranged in pairs or other associations of these lines. Lines 470 and 471 can correspond to lines 270 and 271, respectively, of FIG. 2, or to lines 370 and 371, respectively, of FIG. 3. Lines 472 and 473 of FIG. 4 can also correspond to lines 270 and 271, respectively, of FIG. 2, or to lines 370 and 371, respectively, of FIG. 3.

Selector 440 can include multiplexers 431 and 432 to selectively couple lines 470, 471, 472, and 473 to lines 441 and 442 during a memory operation, such as a read operation. During a memory operation, stored information from selected memory cells 410 or 411 can be transferred from line 470 or line 471 to line 441 for further processing. Stored information from selected memory cells 412 or 413 can be transferred from line 472 or line 473 to line 442 for further processing.

Signal BL0/BL1 on line 441 indicates that line 441 can carry either a signal (e.g., BL0) from line 470 or a signal (e.g., BL1) from line 471. Depending on which of memory cells 410 or 411 are selected to provide stored information, multiplexer 431 is configured to couple either line 470 or line 471 to line 441. Multiplexer 431 can couple line 470 to line 441 or line 471 to line 441 one at time (not simultaneously). For example, if at least one of memory cells 410 is selected to provide stored information to I/O circuit 417, multiplexer 431 is configured to couple line 470 to line 441, leaving line 471 uncoupled (in other words, not coupled) to line 441. Thus, stored information from at least one selected memory cell among memory cells 410 can be transferred from line 470 (e.g., in the form signal BL0) to line 441 by multiplexer 431. In another example, if at least one of memory cells 411 is selected to provide stored information to I/O circuit 417, multiplexer 431 is configured to couple line 471 to line 441, leaving line 470 uncoupled to line 441. Thus, stored information (e.g., in the form signal BL1) from at least one selected memory cell among memory cells 411 can be transferred from line 471 to line 441 by multiplexer 431.

Signal BL2/BL3 on line 442 indicates that line 442 can carry either a signal (e.g., BL2) from line 472 or a signal (e.g., BL3) from line 473. Depending on which of memory cells 412 or 413 are selected to provide stored information, multiplexer 432 is configured to couple either line 472 or line 473 to line 442. Multiplexer 432 can couple line 472 to line 442 or line 473 to line 442 one at time (not simultaneously). For example, if at least one of memory cells 412 is selected to provide stored information to I/O circuit 417, multiplexer 432 is configured to couple line 472 to line 442, leaving line 473 uncoupled to line 442. Thus, stored information from at least one selected memory cell among memory cells 412 can be transferred from line 472 (e.g., in the form signal BL2) to line 442 by multiplexer 432. In another example, if at least one of memory cells 413 is selected to provide stored information to I/O circuit 417, multiplexer 432 is configured to couple line 473 to line 442, leaving line 472 uncoupled to line 442. Thus, stored information (e.g., in the form signal BL3) from at least one selected memory cell among memory cells 413 can be transferred from line 473 to line 442 by multiplexer 432.

Transistors 488 and 489 of memory device 400 may respond to signals CTL01 and CTL23 during a memory operation (e.g., during a read operation) to pass signals on lines 441 and 442 to sense amplifiers 425 and 426, respectively. Transistors 488 and 489 can be constructed (e.g., sized) to operate at (e.g., withstand) a voltage greater than the operating supply voltage (e.g., Vcc) of memory device 400. For example, memory device 400 may operate at a supply voltage of approximately two to five volts and transistors 488 and 489 can operate at a voltage of approximately 20 volts (e.g., supplied by a charge pump of memory device 400). In some memory operations (e.g., an erase operation) of memory device 400, a high voltage (e.g., an erase voltage) may be applied to lines 470, 471, 472, and 473 as part of the operations. Structuring transistors 488 and 489 to operate at a relatively high voltage may allow memory device 400 to operate properly in such memory operations.

Sense amplifiers 425 and 426 of memory device 400 are configured to sense the signals on lines 441 and 442, respectively. As described above, the signal on line 441 corresponds to stored information from memory cells 410 or 411 in a memory operation, such as a read operation. The signal on line 442 corresponds to stored information from memory cells 412 or 413 in a memory operation, such as a read operation. Sense amplifiers 425 and 426 sense the signals on lines 441 and 442 to determine corresponding values of the stored information and transfer the values (e.g., in the form of signals) to I/O circuit 417.

I/O circuit 417, which can correspond to I/O circuit 117 of FIG. 1, may provide the signals representing the stored information to a device (e.g., a processor or a memory controller device) external to memory device 400 for further processing.

Bias units 451 and 452 of memory device 400 are configured to couple lines 470, 471, 472, and 473 to different voltages in different memory operations (read and programming operations), depending which of lines 470, 471, 472, and 473 is a selected line or unselected line during such memory operations.

In the description herein, during a memory operation, a selected line refers to the line that is associated with a selected memory cell during that memory operation. An unselected line refers to the line that is not associated with a selected memory cell during that memory operation.

A selected memory cell refers to the memory cell that is selected to be accessed in a memory operation (e.g., read, programming, or erase operation), so that memory device 400 can sense information stored provided in the selected memory cell (e.g., in a read operation) or write information into the selected memory cell (e.g., in a programming operation). An unselected memory cell refers to a memory cell that is not selected to be accessed during a memory operation.

In FIG. 4, for example, if at least one of memory cells 410 is a selected memory cell during a memory operation (e.g., read or program), then line 470 can be a selected line during that memory operation. If none of memory cells 410 is a selected memory cell during a memory operation, then line 470 can be an unselected line during that memory operation. In another example, if at least one of memory cells 411 is a selected memory cell during a memory operation (e.g., read or program), then line 471 can be a selected line during that memory operation. If none of memory cells 411 is a selected memory cell during a memory operation, then line 471 can be an unselected line during that memory operation.

During a read operation, if line 470 or line 471 is an unselected line, or if both lines 470 and 471 are unselected lines, bias unit 451 is configured to couple the unselected line (470 or line 471) or the unselected lines (470 and 471) to a voltage V0. Voltage V0 can be zero volts (e.g., a reference voltage of zero volts). During a programming operation, if line 470 or line 471 is an unselected line, or if both lines 470 and 471 are unselected lines, bias unit 451 is configured to couple the unselected line (470 or line 471) or the unselected lines (470 and 471) to a voltage V1. Voltage V1 can be a positive voltage, for example, two volts (e.g., a reference voltage of two volts).

During a read operation, if line 472 or line 473 is an unselected line, or if both lines 472 and 473 are unselected lines, bias unit 452 is configured to couple the unselected line (472 or line 473) or the unselected lines (472 and 473) to voltage V0 (e.g., zero volts) During a programming operation, if line 472 or line 473 is an unselected line, or if both lines 472 and 473 are unselected lines, bias unit 452 can operate to couple the unselected line (472 or line 473) or the unselected lines (472 and 473) to voltage V1 (e.g., two volts).

If line 470, 471, 472, or line 471 is a selected line, bias unit 451 or 452 may not couple the selected line to voltage V0 or V1. The voltage (e.g., signal) on the selected line may depend on the value of a selected memory cell associated with the selected line (e.g., in a read operation) or may depend on the value of information to be written into the selected memory cell (e.g., in a programming operation).

Coupling the unselected line, as described above, to voltage V0 or voltage V1 may improve memory operations of memory device, such as may reduce undesired coupling capacitance (e.g., parasitic capacitance) between adjacent lines during the memory operations. For example, if line 470 is a selected line and line 471 is an unselected line, a coupling capacitance between lines 470 and 471 may be reduced if line 471 is coupled to voltage V0 (e.g., during a read operation) or to voltage V1 (e.g., during a programming read operation).

FIG. 4 show bias units 451 and 452 are separated units as an example. The bias units 451 and 452 can be combined into a single bias unit.

FIG. 4 shows an example where each of multiplexers 431 and 432 can be associated with only two lines (e.g., two data lines) and form a 2:1 (two-to-one) multiplexer. In an alternative arrangement, each of multiplexers 431 and 432 can be associated with a group of N lines and form an N:1 multiplexer, where N can be greater than two. In another alternative arrangement, each of multiplexers 431 and 432 can be associated with only one line. In such an alternative arrangement the number of multiplexers can be equal to the number of lines. For example, since FIG. 4 shows an example of four lines 470, 471, 472, and line 471, the number of multiplexers associated these lines in an alternative arrangement can be equal to four.

FIG. 4 shows an example where memory device 400 includes four lines (e.g., 470, 471, 472, and 473) and two multiplexers 431 and 432. The number of lines and the number of multiplexers can vary. The number of lines and the number of multiplexers of memory device 400 can follow the formula S=M÷N, where S is an integer representing the number of multiplexers of memory device 400, M is the total number of lines of memory device 400, and N is the number of lines that can be associated with each multiplexer. As described above, N can be one, two, or greater than two. Thus, if N=1, then S=M.

Multiplexers 431 and 432 in FIG. 4 can include substantially the same elements. For simplicity, the description herein omits detailed description of multiplexer 432, which can include elements similar to those of multiplexer 431, as described below with reference to FIG. 5, FIG. 6, and FIG. 7.

Figure 5:
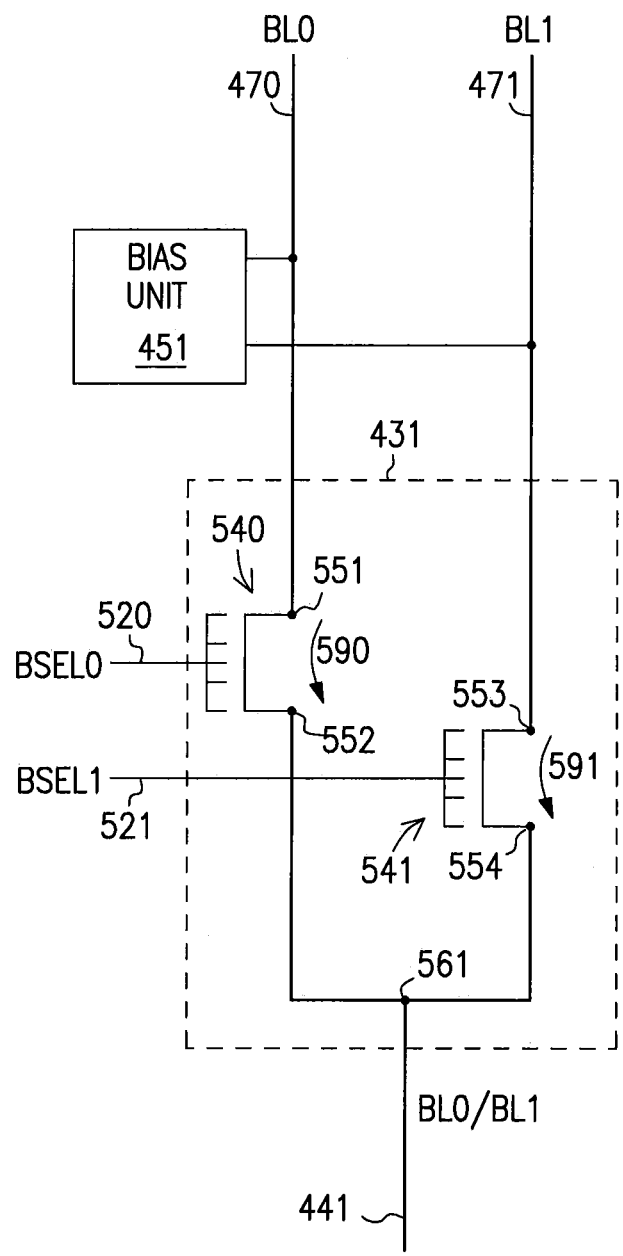
FIG. 5 shows a schematic diagram of a multiplexer of FIG. 4, according to an embodiment of the invention.

FIG. 5 shows a schematic diagram of multiplexer 431 of FIG. 4, according to an embodiment of the invention. As shown in FIG. 5, multiplexer 431 can include a switching circuit 540 coupled between line 470 and line 441, and a switching circuit 541 coupled between line 471 and line 441. FIG. 5 shows a modified transistor symbol for each of switching circuits 540 and 541 to indicate that each of switching circuits 540 and 541 can operate similarly to a transistor. For example, each of switching circuits 540 and 541 can turn on or off in response to a corresponding signal BSEL0 or BSEL1. Although each of switching circuits 540 and 541 can operate similarly to a transistor, each of switching circuits 540 and 541 is not necessarily a single transistor. Detailed description and operations of switching circuits 540 and 541 is described below with reference to FIG. 6 and FIG. 7.

In FIG. 5, switching circuit 540 includes nodes 551 and 552 and line 520 that can correspond to source and drain and a gate, respectively, of a transistor. In response to signal BSEL0 on line 520, switching circuit 540 can turn on and form a conductive path 590 between nodes 551 and 552 to couple line 470 to a node 561, which is coupled to line 441. Conductive path 590 can physically be a U-shaped conductive path, as shown in detail in FIG. 6 and FIG. 7.

In FIG. 5, switching circuit 541 includes nodes 553 and 554 and line 521 that can correspond to drain and source and a gate, respectively, of a transistor. In response to signal BSEL1 on line 521, switching circuit 541 can turn on and form a conductive path 591 between nodes 553 and 554 to couple line 471 to node 561 and line 441. Conductive path 591 can physically be a U-shaped conductive path, as shown in detail in FIG. 6 and FIG. 7.

In FIG. 5, signals BSEL0 and BSEL1 can be activated such that only one of switching circuits 540 and 541 can turn on at a time. Thus, only one of lines 470 and 471 can be coupled to node 561 (and line 441) at a time. Signals BSEL0 and BSEL1 can also be activated such that both switching circuits 540 and 541 can turn off at a given time. For example, both of switching circuits 540 and 541 can turn off (e.g., at the same time) when none of the memory cells (e.g., 410 and 411 in FIG. 4) associated with lines 470 and 471 are selected to provide stored information during read memory operation while some other memory cells (e.g., 412 or 413 in FIG. 4) may be selected provide stored information.

Figure 6:
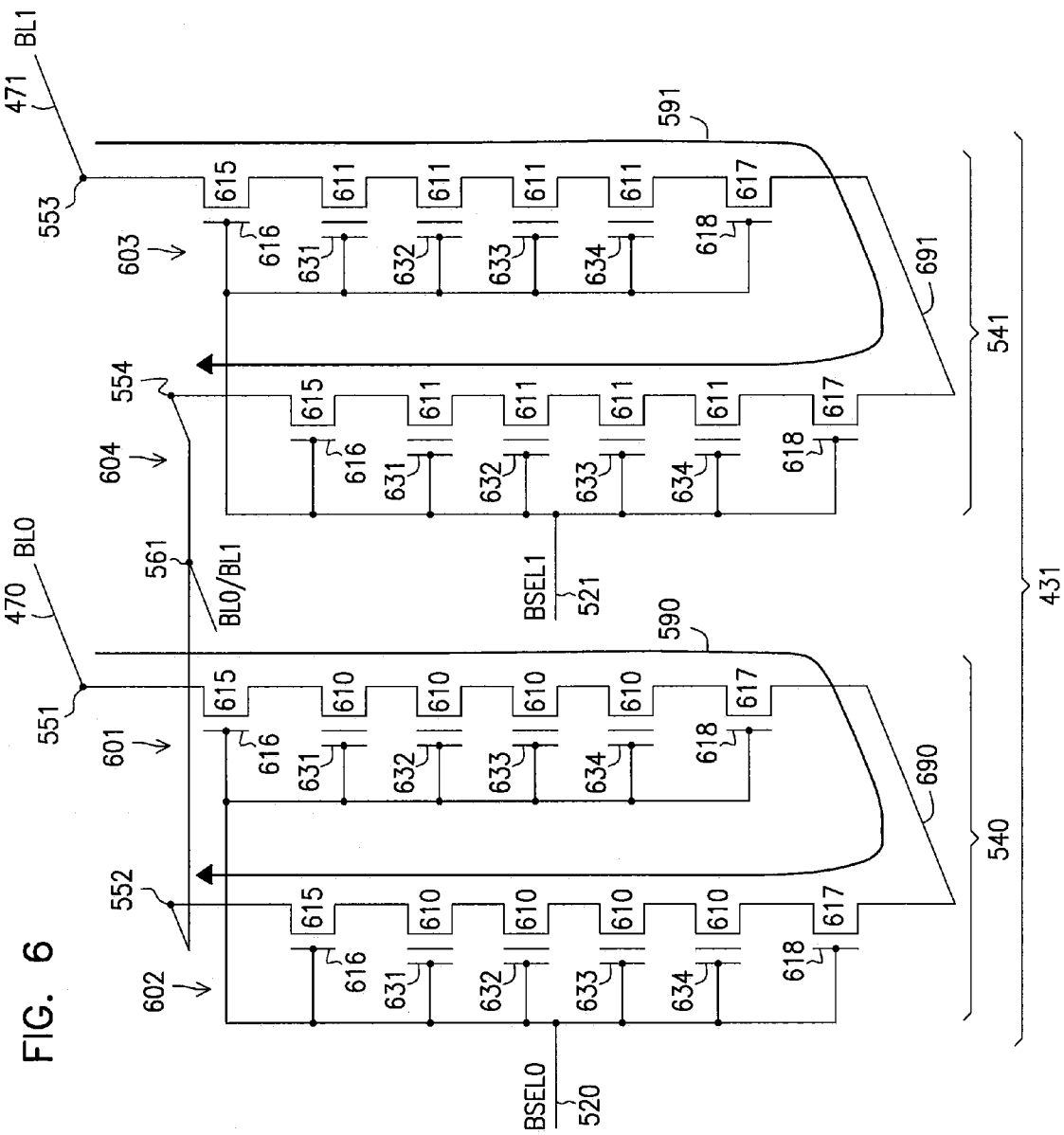
FIG. 6 shows a schematic diagram of switching circuits of FIG. 5, according to an embodiment of the invention.

FIG. 6 shows a schematic diagram of switching circuits 540 and 541 of FIG. 5, according to an embodiment of the invention. In FIG. 6, each of switching circuits 540 and 541 can include elements arranged in a fashion similar to that of two of memory cell strings 201, 202, 203, and 204 of FIG. 2. As described above with reference to FIG. 4, memory cells 410, 411, 412, and 413 (FIG. 4) can also be arranged in memory cell strings, such as memory cell strings 201, 202, 203, and 204 (FIG. 2). Thus, a portion of memory array 402 of memory device 400 can form memory cells 410, 411, 412, and 413 having memory cell strings similar to that of memory cell strings 201, 202, 203, and 204 of FIG. 2. Another a portion of memory array 402 of memory device 400 can form switching circuits 540 and 541, as shown in FIG. 6, that can include elements similar to that of memory cell strings 201, 202, 203, and 204 of FIG. 2. Thus, in memory device 400, switching circuits 540 and 541 (FIG. 6) and memory cells 410, 411, 412, 413 (FIG. 4) can be formed from the same memory array (e.g., memory array 402). In an alternative embodiment, switching circuits 540 and 541 (FIG. 6) can be formed outside memory array 402 (FIG. 4) of memory device 400. In such an alternative embodiment, switching circuits 540 and 541 and memory array 402 can be formed on the same semiconductor substrate.

As shown in FIG. 6, switching circuit 540 can include a portion 601, a portion 602, and a line 690 coupled to portions 601 and 602. Portions 601 and 602 include elements in an arrangement at least substantially similar to that of two memory cell strings, such as memory cell strings 201 and 202 of FIG. 2. For example, as shown in FIG. 6, portion 601 includes transistors 615 and 617 and elements 610 arranged between node 551 and line 690. Portion 601 includes transistors 615 and 617 and elements 610 arranged between node 552 and line 690. Line 690 can be structured as a conductive line having conductive material, such as doped polysilicon, metal, or other conductive material. As shown in FIG. 6, line 690 can be coupled between only transistors 617 of switching circuit 540, such as between only sources of transistors 617 of switching circuit 540.

Elements 610 of switching circuit 540 can have a structure and arrangement similar to or identical to that of memory cells, such as memory cells 210 of FIG. 2. However, in FIG. 6, elements 610 may not be configured to store information. Instead, elements 610 may be configured to operate as pass elements (e.g., transistors) to form a portion of conductive path 590 between nodes 551 and 552.

As shown in FIG. 6, conductive path 590 can physically be a U-shaped conductive path that includes a combination of a path formed by transistors 615 and 617 and elements 610 of portion 601, a path formed by transistors 615 and 617 and elements 610 in portion 602, and a path formed by line 690.

Switching circuit 540 include gates 616 and 618 associated with transistors 615 and 617, respectively, and gates 631, 632, 633, and 634 associated with elements 610. As shown in FIG. 6, gates 616, 618, 631, 632, 633, and 634 of portion 601 along with gates 616, 631, 632, 633, 634, and 618 of portion 602 of switching circuit 540 can receive the same signal BSEL0 from line 520. These gates are also shown as multiple gates in the modified transistor symbol associated with switching circuit 540 in FIG. 5.

Switching circuit 541 of FIG. 6 can include a portion 603, a portion 604, and a line 691 coupled to portions 603 and 604. Portions 603 and 604 include elements and an arrangement at least substantially similar to that of two memory cell strings, such as memory cell strings 201 and 202 of FIG. 2. For example, as shown in FIG. 6, portion 603 includes transistors 615 and 617 and elements 611 arranged between node 551 and line 691. Portion 603 includes transistors 615 and 617 and elements 611 arranged between node 553 and line 691. Line 691 can include a conductive line having conductive material, such as doped polysilicon, metal, or other conductive material. As shown in FIG. 6, line 691 can be coupled between only transistors 617 of switching circuit 541, such as between only sources of transistors 617 of switching circuit 541.

In FIG. 6, elements 611 of switching circuit 541 can have a structure and/or an arrangement similar to or identical to that of memory cells, such as memory cells 211 of FIG. 2. However, elements 611 may not be configured to store information. Instead, elements 610 may be configured to operate as pass elements (e.g., transistors) to form a portion of conductive path 591 between nodes 553 and 554.

As shown in FIG. 6, conductive path 591 can physically be a U-shaped conductive path that includes a combination of a path formed by transistors 615 and 617 and elements 610 in portion 603, a path formed by transistors 615 and 617 and elements 610 in portion 604, and a path formed by line 691.

Switching circuit 541 include gates 616 and 618 associated with transistors 615 and 617, respectively, and gates 631, 632, 633, and 634 associated with elements 611. As shown in FIG. 6, gates 616, 618, 631, 632, 633, and 634 of portion 603 along with gates 616, 631, 632, 633, 634, and 618 of portion 604 of switching circuit 541 can receive the same signal BSEL1 from line 521. These gates are also shown as multiple gates in the modified transistor symbol associated with switching circuit 541 in FIG. 5.

In a memory operation of multiplexer 431 of FIG. 6, each of signal BSEL0 and BSEL1 can be provided with a respective voltage value such that transistors 615 and 617 and elements 610 of switching circuit 540 and transistors 615 and 617 and elements 610 of switching circuit 541 can respectively turn on (e.g., to form conductive path 590 or 591) or turn off (e.g., so that conductive path 590 or 591 is not formed).

Table 1 shows example values of voltages that can be applied to signal BSEL0 (when line 470 is selected or unselected) and signal BSEL1 (when line 471 is selected or unselected) during read, programming, and erase operations.

TABLE 1

|  | Read | Programming | Erase |
| --- | --- | --- | --- |
| BSEL0 (line 470 selected) | V2 | V2 | Verase |
| BSEL0 (line 470 unselected) | V0 | V0 | Verase |
| BSEL1 (line 471 selected) | V2 | V2 | Verase |
| BSEL1 (line 471 unselected) | V0 | V0 | Verase |

Voltage V0 in Table 1 can have a value that can turn off (or keep off) transistors 615 and 617 and/or elements 610 and 611, so that conductive path 590 or 591 is not formed. For example, voltage V0 can be zero volts.

Voltage V2 in Table 1 can have a value that can turn on transistors 615 and 617 and can turn on elements 610 and 611 to operate as pass elements to form conductive path 590 or 591. For example, voltage V2 can have a value of approximately five volts.

Voltage Verase in Table 1 can correspond to a voltage having a value that can clear information stored in the memory cells of memory device 400 (e.g., 410, 411, 412, or 413 in FIG. 4). For example, voltage Verase can have a value of approximately 20 volts.

FIG. 6 shows an example where gates of switching circuits 540 and 541 can be coupled to lines 520 and 521, respectively, to receive signal BSEL0 and BSEL1, respectively. The gates of switching circuits 540 and 541 can be coupled in another way.

Figure 7:
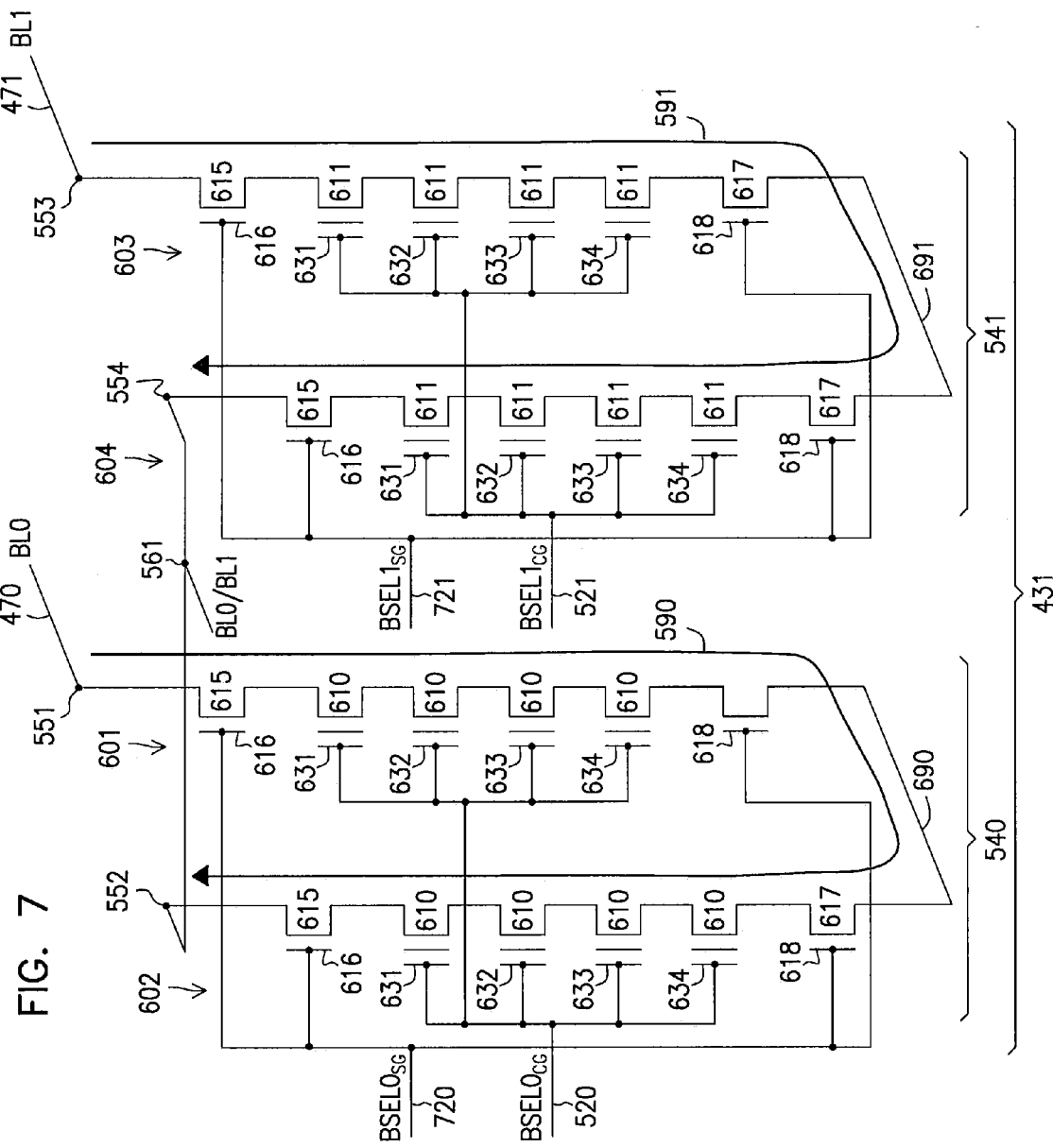
FIG. 7 shows a schematic diagram of the switching circuits of FIG. 5 with separate gates in each of the switching circuits, according to an embodiment of the invention.

FIG. 7 shows a schematic diagram of switching circuits 540 and 541 of FIG. 5 with separate gates in each of switching circuits 540 and 541, according to an embodiment of the invention. Switching circuits 540 and 541 in FIG. 7 can be a variation of switching circuits 540 and 541 of FIG. 6.

As shown in FIG. 7, the gates of switching circuit 540 can be divided into two groups, one group having gates 616 and 618 coupled to a line 720 and another group having gates 631, 632, 633, and 634 of both portions 601 and 602 coupled to line 520. Lines 520 and 720 can receive different signals BSEL0$_{SG}$ and BSEL0$_{CG}$, respectively. The gates of switching circuit 541 can be divided into two groups, with one group having gates 616 and 618 coupled to a line 721 and another group having gates 631, 632, 633, and 634 of both portions 603 and 604 coupled to line 521. Lines 521 and 721 can receive different signals BSEL1$_{SG}$ and BSEL1$_{CG}$, respectively.

Table 2 shows example values of voltages that can be applied to signals BSEL0$_{SG}$ and BSEL0$_{CG}$ (when line 470 is selected or unselected) and signals BSEL1$_{SG}$ and BSEL1$_{CG}$ (when line 471 is selected or unselected) during initialization, read, programming, and erase operations.

TABLE 2

|  | Initialization | Read | Programming | Erase |
| --- | --- | --- | --- | --- |
| BSEL0$_{SG}$ (line 470 selected) | Vinit | V2 | V2 | Verase |
| BSEL0$_{CG}$ (line 470 selected) | V0 | V3 | V3 | Verase |
| BSEL0$_{SG}$ (line 470 unselected) | Vinit | V0 | V0 | Verase |
| BSEL0$_{CG}$ (line 470 unselected) | V0 | V0 | V0 | Verase |
| BSEL1$_{SG}$ (line 471 selected) | Vinit | V2 | V2 | Verase |
| BSEL1$_{CG}$ (line 471 selected) | V0 | V3 | V3 | Verase |
| BSEL1$_{SG}$ (line 471 unselected) | Vinit | V0 | V0 | Verase |
| BSEL1$_{CG}$ (line 471 unselected) | V0 | V0 | V0 | Verase |

Voltages V0, V2, and Verase in Table 2 can have the same values as those in Table 1. In Table 2, voltage V3 can have a value equal to the value of voltage V2. Alternatively, voltage V3 can have a value different from that of voltage V2 provided that such a different voltage value of V3 can also turn on elements 610 and 611 to operate as pass elements to form conductive path 590 or 591. Voltage Vinit in Table 2 can have a value equal to the value of voltage Verase. For example, initialization voltage Vinit can have a value of approximately 20 volts.

The initialization operation associated with Table 2 can be performed to improve the performance of switching circuit 540 and 541, such as to reduce channel impedance in conductive paths 690 and 691. For example, since elements 610 and 611 of switching circuit 540 and 541 have a structure substantially the same as a structure of a memory cell (e.g., 210 or 211 of FIG. 2), charge may be trapped in the structure of elements 610 and 611. Such charge may increase the channel impedance of conductive paths 690 and 691. Performing the initialization operation may reduce the trapped charge, thereby channel impedance may also be reduced. The initialization operation can be performed only one time or more than one time. For example, the initialization operation can be performed at each power-on sequence of memory device 400. In another example, the initialization operation can be performed after every multiple power-on sequences of memory device 400.

In some cases, the initialization operation may be omitted. For example, the initialization operation may be omitted if the charges in elements 610 and 611 are determined to be sufficiently low right after fabrication of memory device 400, such that operations of elements 610 and 611 may be unaffected by the low charges.

FIG. 7 shows an example where gates 616 and 618 in switching circuit 540 are coupled to the same line 720 and gates 616 and 618 in switching circuit 541 are coupled to the same line 721. Alternatively, in each of switching circuits 540 and 541, gates 616 and gates 618 can be coupled to two separate lines, one line for gates 616 and another line for gates 618. In such an arrangement, the two separate lines in each of each of switching circuits 540 and 541 can have two different signals but can have the same voltage value, such as the value associated with signal BSEL0$_{SG}$ (or signal BSEL1$_{SG}$) of Table 2.

Figure 8:
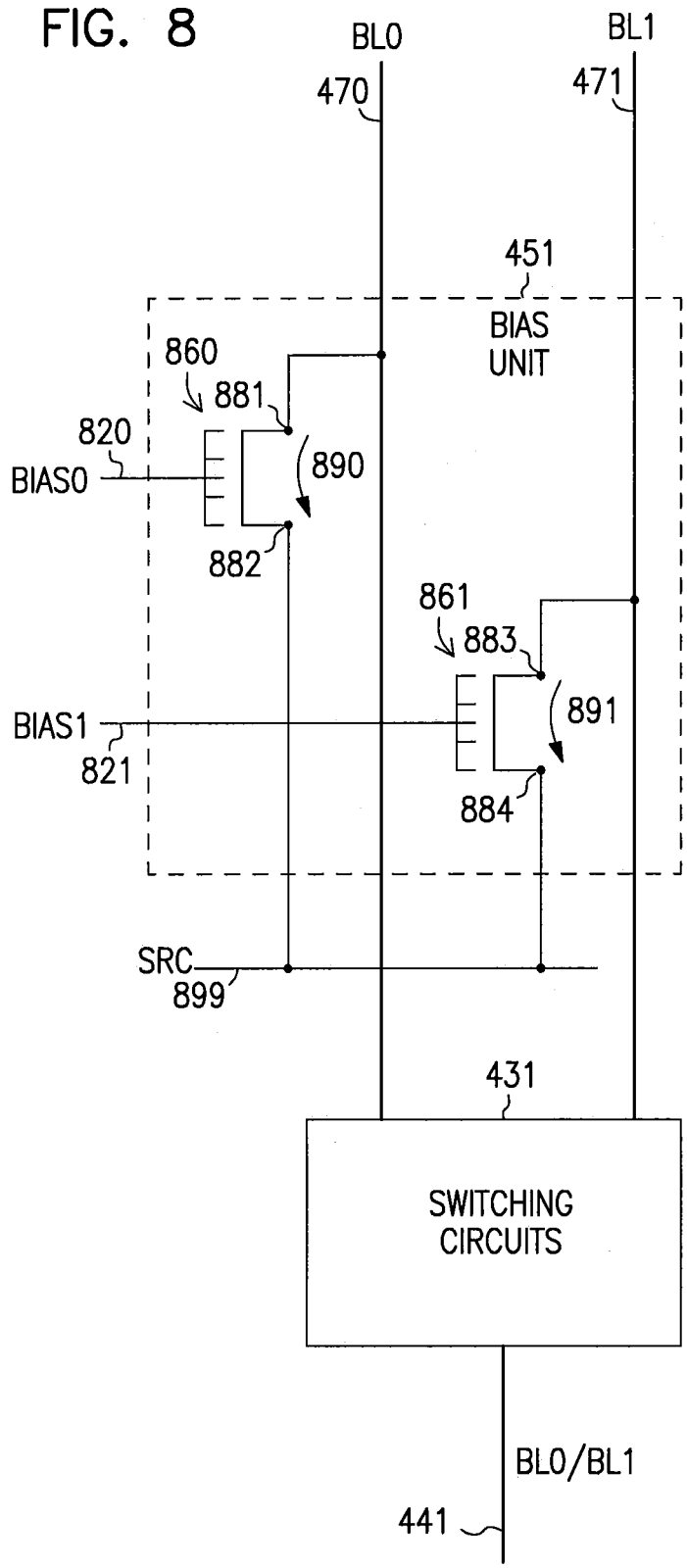
FIG. 8 shows a schematic diagram of a bias unit of FIG. 4, according to an embodiment of the invention.

FIG. 8 shows a schematic diagram of bias unit 451 of FIG. 4, according to an embodiment of the invention. As shown in FIG. 8, bias unit 451 includes a bias circuit 860 coupled between line 470 and a line 899, and a bias circuit 861 coupled between line 471 and line 899. Similarly to FIG. 5, FIG. 8 shows a modified transistor symbol for each of bias circuits 860 and 861 to indicate that each of bias circuits 860 and 861 can operate similarly to a transistor. For example, each of bias circuits 860 and 861 can turn on or off in response to a corresponding signal BIAS0 or BIAS1. Although each of bias circuits 860 and 861 can operate similarly to a transistor, each of bias circuits 860 and 861 is not necessarily a single transistor. Detailed description and operations of bias circuits 860 and 861 is described below with reference to FIG. 9A and FIG. 9B.

Bias circuit 860 includes nodes 881 and 882 and line 820 that can correspond to drain and source and a gate, respectively, of a transistor. In response to signal BIAS0 on line 820, bias circuit 860 can turn on and form a conductive path 890 between nodes 881 and 882 to couple line 470 to line 899.

Bias circuit 861 includes nodes 883 and 884 and line 821 that can correspond to drain and source and a gate, respectively, of a transistor. In response to signal BIAS1 on line 821, bias circuit 861 can turn on and form a conductive path 891 between nodes 883 and 884 to couple line 471 to line 899.

Line 899 can be part of a source line of memory device 400 (FIG. 4) to carry a signal SRC. A reference voltage can be applied to line 899 during memory operation. For example, during a read operation, a programming operation, and an erase operation, a reference voltage of zero volts, approximately two volts, and approximately 20 volts, respectively, can be applied to line 899. Thus, signal SRC on line 899 can be provided with a reference voltage of zero volts, approximately two volts, and approximately 20 volts in different memory operations, for example.

Bias circuit 860 can couple line 470 to line 899 or decouple line 470 from line 899, depending on whether line 470 is a selected line or an unselected line. Bias circuit 860 can couple line 471 to line 899 or decouple line 471 from line 899, depending on whether line 471 is a selected line or an unselected line.

Thus, during a memory operation such as a read operation, one of one of lines 470 and 471 (e.g., line 470) can be coupled to line 899 and the other line (e.g., line 471) can be decoupled from line 899. For example, if at least one of the memory cells (e.g., 410 in FIG. 4) associated with line 470 is selected to provide stored information to line 470 during a read operation and if none of the memory cells (e.g., 411 in FIG. 4) associated with line 471 are selected to provide stored information to line 471 during the memory operation, bias circuit 860 can decouple line 470 from line 899 and bias circuit 861 can couple line 471 to line 899.

Each of bias circuits 860 and 861 can include elements and structure similar to or identical to that of the memory cells 410, 411, 412, and 413 of memory device 400 of FIG. 4.

Bias unit 452 shown in FIG. 4 can include substantially the same elements as those of bias unit 451 of FIG. 8. For example, bias unit 452 (FIG. 4) can include bias circuits coupled to lines 472, 473, and line 899 in a fashion similar to that of bias circuits 860 and 861 coupled to lines 470, 471, and line 899 of FIG. 8. For simplicity, the description herein omits detailed description of bias unit 452 of FIG. 4. Bias unit 452 of FIG. 4 can include elements similar to those of bias circuit 451 described below with reference to FIG. 9A and FIG. 9B.

Figure 9A:
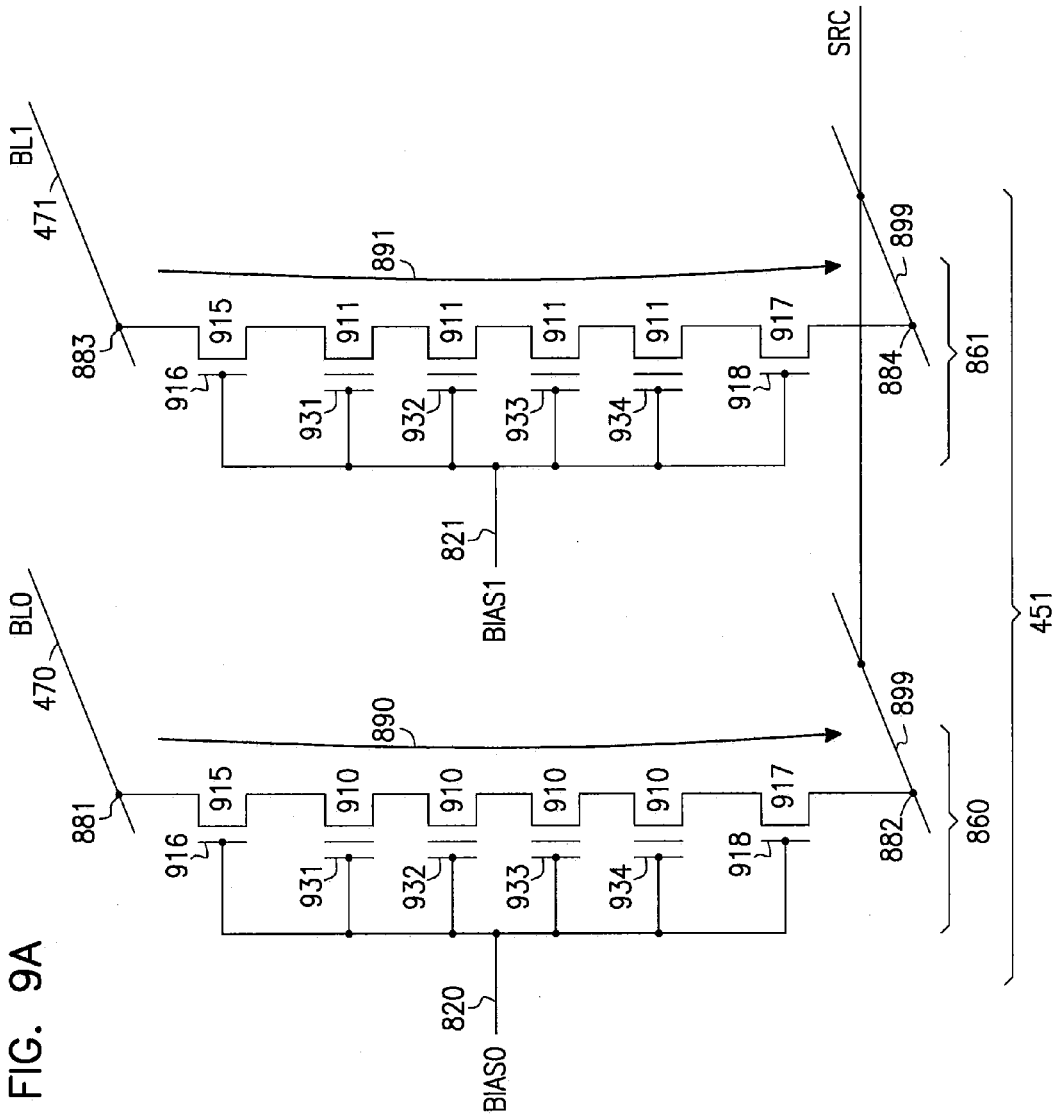
FIG. 9A shows a schematic diagram of bias circuits of FIG. 8, according to an embodiment of the invention.

FIG. 9A shows a schematic diagram of bias circuits 860 and 861 of FIG. 8, according to an embodiment of the invention. In FIG. 9A, each of bias circuits 860 and 861 can include elements arranged in a fashion at least substantially similar to that of one of memory cell strings 201, 202, 203, and 204 of FIG. 2. As described above with reference to FIG. 4 and FIG. 6, memory cells 410, 411, 412, and 413 (FIG. 4) can be arranged in memory cell strings, such as memory cell strings 201, 202, 203, and 204 (FIG. 2). Thus, a portion of memory array 402 of memory device 400 can form memory cells 410, 411, 412, and 413 having memory cell strings similar to that of memory cell strings 201, 202, 203, and 204 of FIG. 2. Another portion of memory array 402 of memory device 400 can form switching circuits 540 and 541 (as shown in FIG. 6) that can include elements similar to that of memory cell strings 201, 202, 203, and 204 of FIG. 2. A further portion of memory array 402 of memory device 400 can form bias circuits 860 and 861, as shown in FIG. 9A, that can include elements similar to that of memory cell strings 201, 202, 203, and 204 (FIG. 2). Thus, in memory device 400, switching circuits 540 and 541 (FIG. 6), bias circuit 860 and 861 (FIG. 9A), and memory cells 410, 411, 412, 413 (FIG. 4) can be formed from the same memory array (e.g., memory array 402). In an alternative embodiment, switching circuits 540 and 541 or bias circuits 860 and 861, or switching circuits 540 and 541 and bias circuits 860 and 861 can be formed outside memory array 402 (FIG. 4) of memory device 400. In such an alternative embodiment, switching circuits 540 and 541, bias circuits 860 and 861, and memory array 402 can be formed on the same semiconductor substrate.

As shown in FIG. 9A, bias circuit 860 can include transistors 915 and 917 and other elements 910 arranged between node 881 and line 899 in a fashion similar to that of memory cell string 201 of FIG. 2. In FIG. 9A, elements 910 of bias circuit 860 can have a structure similar to that of memory cells 210 of FIG. 2. However, elements 910 may not be configured to store information. Instead, elements 910 may be configured to operate as pass elements (e.g., transistors) to form a portion of conductive path 890 between nodes 881 and 882. As shown in FIG. 9A, conductive path 890 includes a path formed by a combination of transistors 915 and 917 and elements 910 between nodes 881 and 882.

Bias circuit 860 include gates 916 and 918 associated with transistors 915 and 917 and gates 931, 932, 933, and 934 associated with elements 910. As shown in FIG. 6, gates 916, 918, 931, 932, 933, and 934 of bias circuit 860 can receive the same signal BIAS0 from line 820. These gates are shown as multiple gates of the transistor symbol associated with bias circuit 860 in FIG. 8.

Bias circuit 861 can include transistors 915 and 917 and elements 911 arranged between node 883 and line 899 in a fashion similar to that of memory cell string 201 of FIG. 2. In FIG. 9A, elements 910 of bias circuit 861 can have a structure similar to that of memory cells 211 of FIG. 2. However, in memory device 400 (FIG. 4), elements 910 may not be configured to store information. Instead, elements 910 may be configured to operate as pass elements (e.g., transistors) to form a portion of conductive path 891 between nodes 883 and 884. As shown in FIG. 9A, conductive path 891 includes a path formed by a combination of transistors 915 and 917 and elements 910 between nodes 883 and 884.

Bias circuit 861 include gates 916 and 918 associated with transistors 915 and 917 and gates 931, 932, 933, and 934 associated with elements 910. Gates 916, 918, and gates 931, 932, 933, and 934 of bias circuit 861 can receive the same signal BIAS1 from line 821. These gates are also shown as multiple gates of the transistor symbol associated with bias circuit 861 in FIG. 8.

In a memory operation, each of signals BIAS0 and BIAS1 can be provided with a respective voltage value such that transistors 915 and 917 and elements 910 of bias circuit 860 and transistors 915 and 917 and elements 910 of bias circuit 861 can respectively turn on (e.g., to form conductive path 890 or 891) or turn off (e.g. so that conductive path 890 or 891 is not formed).

Table 3 shows example values of voltages that can be applied to signal BIAS0 (when line 470 is selected or unselected) and signal BIAS1 (when line 471 is selected or unselected) during read, programming, and erase operations.

TABLE 3

|  | Read | Programming | Erase |
| --- | --- | --- | --- |
| BIAS0 (line 470 selected) | V2 | V2 | Verase |
| BIAS0 (line 470 unselected) | V0 | V0 | Verase |
| BIAS1 (line 471 selected) | V2 | V2 | Verase |
| BIAS1 (line 471 unselected) | V0 | V0 | Verase |
| SRC | V0 | V1 | Verase |

Voltages V0, V2, and Verase in Table 3 can have the same values as those in Table 1. Voltage V1 can be a positive voltage, for example, two volts.

FIG. 9A shows an example where gates of bias circuits 860 and 861 can be coupled to lines 820 and 821, respectively, to receive signal BIAS0 or BIAS1. The gates of bias circuits 860 and 861 can be coupled in another way.

Figure 9B:
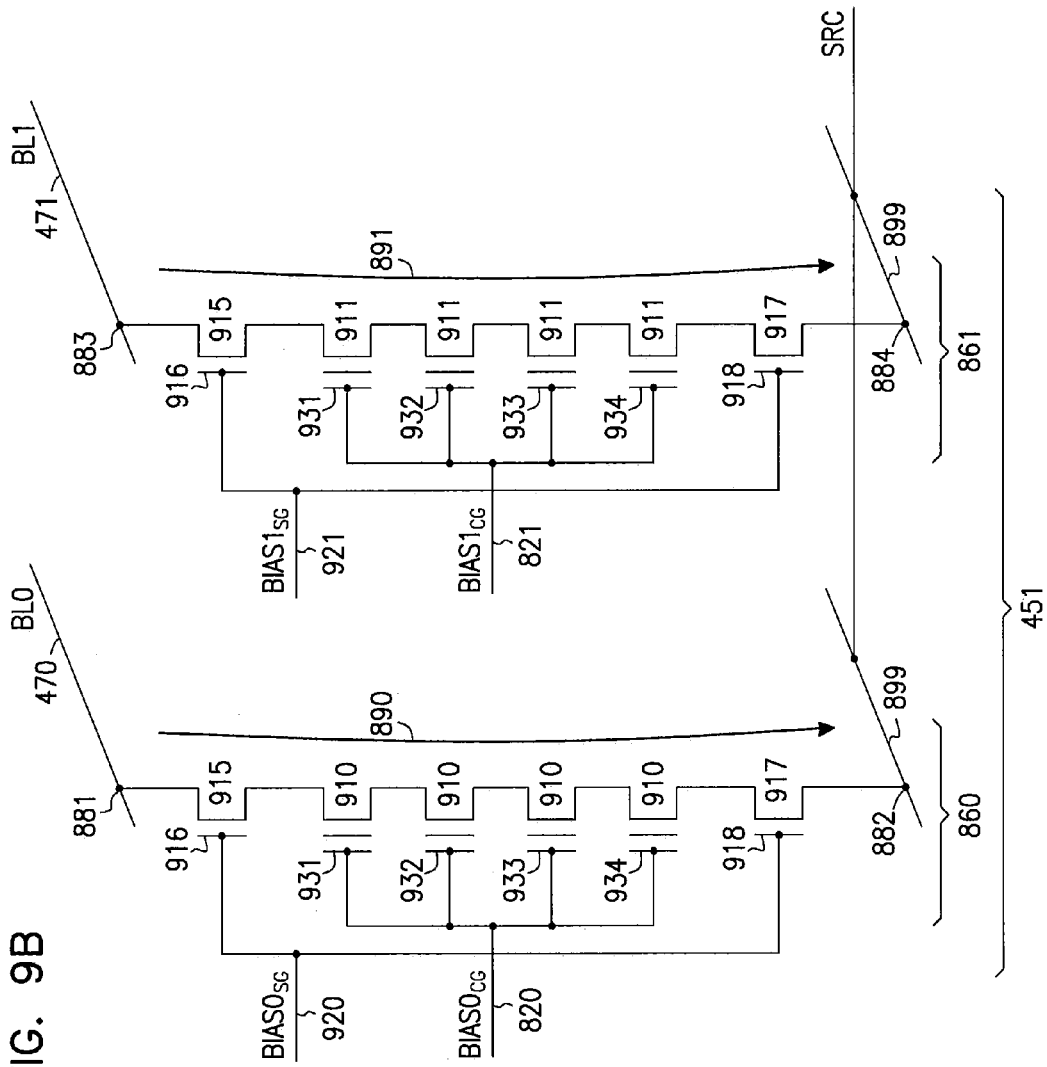
FIG. 9B shows a schematic diagram of the bias circuits of FIG. 8 with separate gates in each of the bias circuits, according to an embodiment of the invention.

FIG. 9B shows a schematic diagram of bias circuits 860 and 861 of FIG. 8 with separate gates in each of bias circuits 860 and 861, according to an embodiment of the invention. Bias circuits 860 and 861 in FIG. 9B can be a variation of bias circuits 860 and 861 of FIG. 9A.

As shown in FIG. 9B, the gates of bias circuit 860 can be divided into two groups, one group having gates 916 and 918 coupled to line 920 and another group having gates 931, 932, 933, and 934 coupled to line 820. Lines 820 and 920 can receive different signals $BIAS0_{SG}$ and $BIAS0_{CG}$, respectively. The gates of bias circuit 861 can be divided into two groups, with one group having gates 916 and 918 coupled to line 921 and another group having gates 931, 932, 933, and 934 coupled to line 821. Lines 821 and 921 can receive different signals $BIAS1_{SG}$ and $BIAS1_{CG}$, respectively.

Table 4 shows example values of voltages that can be applied to signals $BIAS0_{SG}$ and $BIAS0_{CG}$ (when line 470 is selected or unselected) and signals $BIAS1_{SG}$ and $BIAS1_{CG}$ (when line 471 is selected or unselected) during initialization, read, programming, and erase operations.

TABLE 4

|  | Initialization | Read | Programming | Erase |
| --- | --- | --- | --- | --- |
| $BIAS0_{SG}$ (line 470 selected) | Vinit | V2 | V2 | Verase |
| $BIAS0_{CG}$ (line 470 selected) | V0 | V3 | V3 | Verase |
| $BIAS0_{SG}$ (line 470 unselected) | Vinit | V0 | V0 | Verase |
| $BIAS0_{CG}$ (line 470 unselected) | V0 | V0 | V0 | Verase |
| $BIAS1_{SG}$ (line 471 selected) | Vinit | V2 | V2 | Verase |
| $BIAS1_{CG}$ (line 471 selected) | V0 | V3 | V3 | Verase |
| $BIAS1_{SG}$ (line 471 unselected) | Vinit | V0 | V0 | Verase |
| $BIAS1_{CG}$ (line 471 unselected) | V0 | V0 | V0 | Verase |
| SRC | Vinit | V0 | V1 | Verase |

Voltages V0, V1, V2, V3, Vinit, and Verase in Table 4 can have the same values as those in Table 2 and Table 3.

The initialization operation associated with Table 4 can be performed to improve the performance of bias circuits 860 and 861, such as to reduce channel impedance in conductive paths 890 and 891. For example, since elements 910 and 911 of bias circuits 860 and 861 have a structure substantially the same as a structure of a memory cell (e.g., 210 or 211 of FIG. 2), charge may be trapped in the structure of elements 910 and 911. Such charge may increase the channel impedance of conductive paths 890 and 891. Performing the initialization operation may eliminate or reduce the trapped charge, thereby channel impedance may also be reduced. The initialization operation can be performed only one time or more than one time. For example, the initialization operation can be performed at each power-on sequence of memory device 400 (FIG. 4). In another example, the initialization operation can be performed after every multiple power-on sequences of memory device 400.

In some cases, the initialization operation may be omitted. For example, the initialization operation may be omitted if the charges in elements 910 and 911 are determined to be sufficiently low right after fabrication of memory device 400.

The initialization operation associated with bias circuits 860 and 861 and the initialization operation (Table 4) associated with switching circuit 540 and 540 (Table 2) can be performed at the same time or at different times.

FIG. 9B shows an example where gates 916 and 918 in bias circuit 860 are coupled to the same line 920 and gates 916 and 918 in bias circuit 861 are coupled to the same line 921. Alternatively, in each of bias circuits 860 and 861, gate 916 and gate 918 can be coupled to two separate lines, one line for gate 916 and another line for gate 918. In such an arrangement, the two separate lines in each of each of bias circuits 860 and 861 can have two different signals but with the same voltage value, such as the value associated with signal $BIAS0_{SG}$ (or signal $BIAS1_{SG}$) of Table 4.

Figure 10:
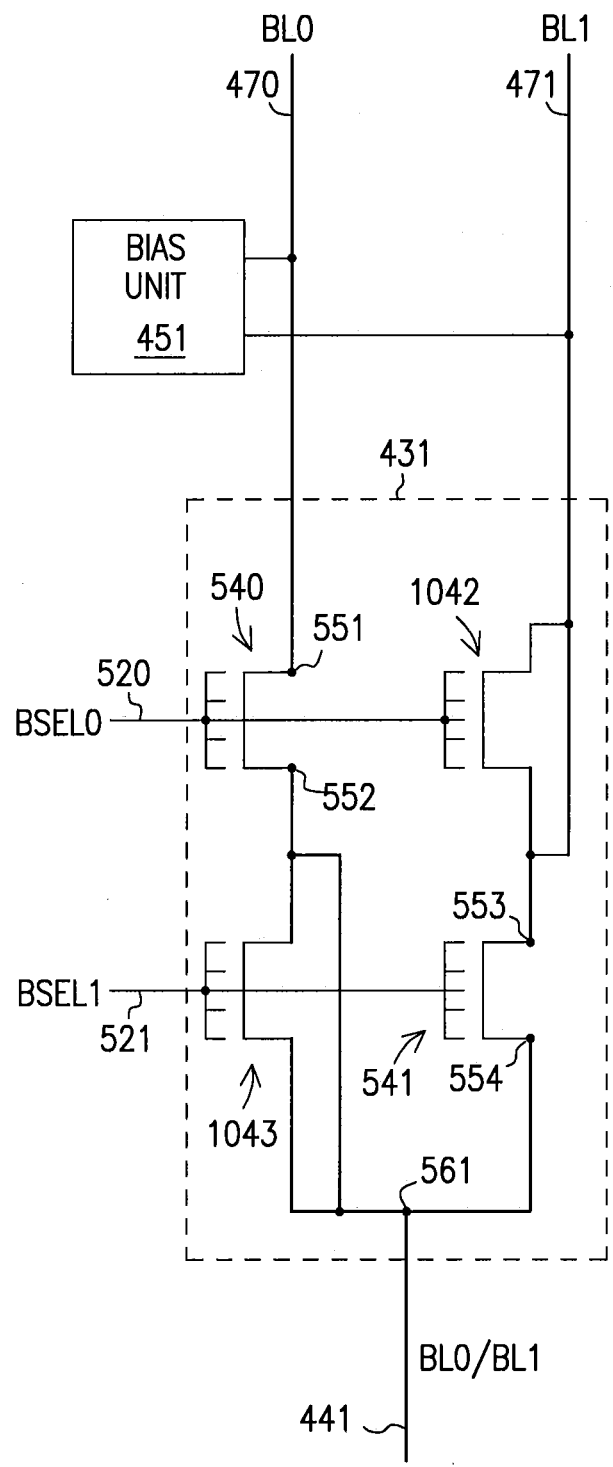
FIG. 10 shows a schematic diagram of a multiplexer of FIG. 4 including additional switching circuits, according to an embodiment of the invention.

FIG. 10 shows a schematic diagram of multiplexer 431 of FIG. 4 including switching circuits 1042 and 1043, according to an embodiment of the invention. Multiplexer 431 in FIG. 10 can be a variation of multiplexer 431 in FIG. 5. Multiplexer 431 in FIG. 10 and in FIG. 5 have the same function, which is to selectively couple lines 470 and 471 to node 561 during a memory operation.

Multiplexer 431 in FIG. 10 can be a portion of memory array 402 of memory device 400 (FIG. 4) in which the gates of switching circuits 540 may be physically coupled to respective gates of switching circuit 1042 as part of a process of forming the entire memory array 402. Thus, although switching circuits 1042 may be present in multiplexer 431, switching circuits 1042 may be unused because multiplexer 431 can still couple line 471 to line 441 using only switching circuit 541.

Similarly, gates of switching circuits 541 may be physically coupled to respective gates of switching circuits 1043 as part of a process of forming the entire memory array 402. Thus, although switching circuits 1043 may be present in multiplexer 431, switching circuits 1043 may be unused because multiplexer 431 can still couple line 470 to line 441 using only switching circuit 540.

Figure 11:
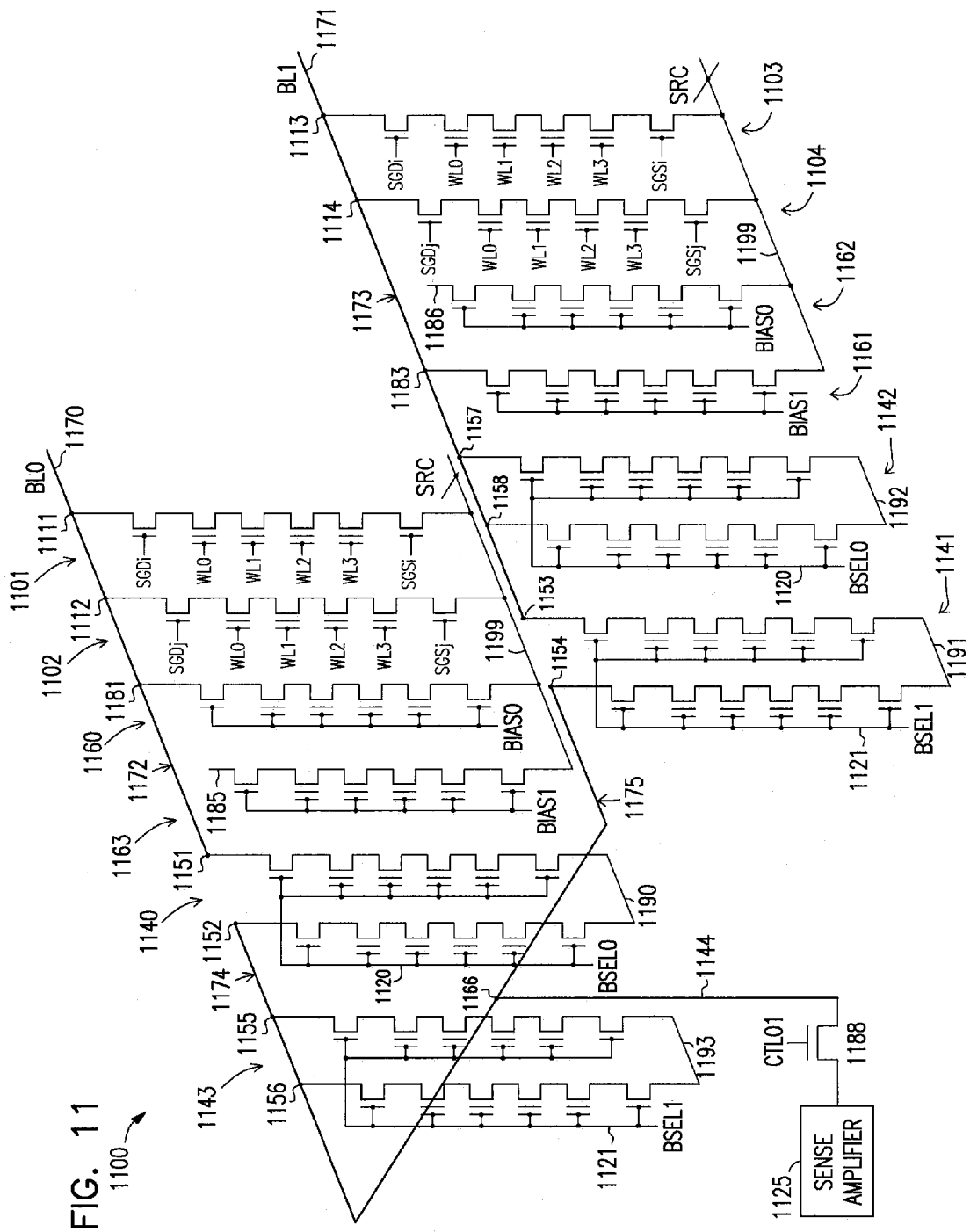
FIG. 11 shows a schematic diagram of a portion of a memory device including lines, memory cell strings, bias circuits, and switching circuits, according to an embodiment of the invention.

FIG. 11 shows a schematic diagram of a portion of a memory device 1100 including lines 1170 and 1171, memory cell strings 1101, 1102, 1103, and 1104, bias circuits 1160, 1161, 1162, and 1163, and switching circuits 1140, 1141, 1142, and 1143, according to an embodiment of the invention.

Lines 1170 and 1171 (with associated signals BL0 and BL1) can correspond to lines 470 and 471, respectively, described above with reference to FIG. 4 through FIG. 10. As shown in FIG. 11, line 1170 can include segments 1172 and 1174 separated from each other. Line 1171 can include segments 1173 and 1175 separated from each other. Memory device 1100 shows an example of two lines (e.g., data lines) 1170 and 1171. The number of lines may vary.

Memory cell strings 1101, 1102, 1103, and 1104 and associated signals SGDi, SGDj, and WL0, WL1, WL2, and WL3 can correspond to those of memory cell strings 201, 202, 203, and 204 and their associated signals of FIG. 2. In memory cell strings 1101, 1102, 1103, and 1104, the gates with the same associated signal (e.g., SGDi, SGDj, WL0, WL1, WL2, WL3, SGSi, or SGSj) can be coupled to together.

As shown in FIG. 11, memory cell strings 1101 and 1102 can be coupled to line 1170 at nodes 1111 and 1112, respectively. Memory cell strings 1103 and 1104 can be coupled to line 1171 at nodes 1113 and 1114, respectively. Each of memory cell strings 1101, 1102, 1103, and 1104 can also be coupled to line 1199, which can be coupled to a line associated with signal SRC.

Bias circuits 1160 and 1161 can be coupled to lines 1170 and 1171 at nodes 1181 and 1183, respectively. Bias circuits 1160 and 1161 can correspond to and operate similarly to bias circuits 860 and 861, respectively, of FIG. 8 and FIG. 9A and FIG. 9B. For example, during a read operation, bias circuit 1160 can respond to signal BIAS0 to couple line 1170 to line 1199 if none of the memory cells in memory cell strings 1101 and 1102 are selected to provide stored information. During a read operation, bias circuit 1160 can also respond to signal BIAS0 to decouple line 1170 from line 1199 if at least one of the memory cells in memory cell strings 1101 and 1102 is selected to provide stored information.

Bias circuit 1161 can respond to signal BIAS1 during a read operation to couple line 1171 to line 1199 if none of the memory cells in memory cell strings 1103 and 1104 are selected to provide stored information to line 1171. Bias circuit 1161 can also respond to signal BIAS1 during a read operation to decouple line 1171 from line 1199 if at least one of the memory cells in memory cell strings 1103 and 1104 is selected to provide stored information.

Bias circuits 1162 and 1163 may be unused. As shown in FIG. 11, the gates of bias circuit 1162 and the gates of bias circuit 1160 can be associated with the same signal BIAS0. As part of a process of forming the entire memory array of memory device 1100, the gates of bias circuit 1162 can be physically coupled to respective gates of bias circuit 1160. Thus, although bias circuit 1162 may be present in memory device 1100, as shown in FIG. 11, bias circuit 1162 may be unused because line 1171 can still be coupled to line 1199 using only bias circuit 1161 if line 1171 is unselected. Since bias circuit 1162 may be unused, node 1186 of bias circuit 1162 can be uncoupled to line 1171.

Similarly, as shown in FIG. 11, the gates of bias circuit 1163 and the gates of bias circuit 1161 can be associated with the same signal BIAS1. As part of a process of forming the entire memory array of memory device 1100, the gates of bias circuit 1163 can be physically coupled to respective gates of bias circuit 1161. Thus, although bias circuit 1163 may be present in memory device 1100, as shown in FIG. 11, bias circuit 1163 may be unused because line 1170 can still be coupled to line 1199 using only bias circuit 1160 if line 1170 is unselected. Since bias circuit 1163 may be unused, node 1185 of bias circuit 1163 can be uncoupled to line 1170.

Switching circuit 1140 can correspond to and operate similarly to switching circuit 540 of FIG. 5, FIG. 6, and FIG. 7. For example, switching circuit 1140 can respond to signal BSLE0 on line 1120 during a memory operation to form a conductive path between nodes 1151 and 1152, such that line 1170 can be coupled to line 1144. As shown in FIG. 11, switching circuit 1140 can include elements arranged between node 1151 and a line 1190 and between node 1152 and line 1190 in a fashion similar to that of switching circuit 540 (FIG. 5 and FIG. 6) where line 1190 of FIG. 11 can correspond to line 690 of FIG. 6. Node 1166 and line 1144 in FIG. 11 can correspond to node 561 and line 441, respectively, of FIG. 5.

Switching circuit 1141 in FIG. 11 can correspond to and operate similarly to switching circuit 541 of FIG. 5, FIG. 6, and FIG. 7. For example, switching circuit 1141 can respond to signal BSLE0 on line 1121 during a memory operation to form a conductive path between nodes 1153 and 1154, such that line 1171 can be coupled to line 1144. As shown in FIG. 11, switching circuit 1141 can include elements arranged between node 1153 and a line 1191 and between node 1154 and line 1191 in a fashion similar to that of switching circuit 541 (FIG. 6) where line 1191 of FIG. 11 can correspond to line 691 of FIG. 6.

Switching circuits 1142 and 1143 can correspond to switching circuits 1042 and 1043 of FIG. 10. Thus, switching circuits 1142 and 1143 may be unused. As shown in FIG. 11, the gates of switching circuit 1142 and the gates of switching circuit 1140 can be associated with the same signal BSEL0. As part of a process of forming the memory array, the gates of switching circuit 1142 can be coupled to respective gates of switching circuit 1140. Thus, although switching circuit 1142 may be present in memory device 1100, as shown in FIG. 11, switching circuit 1142 may be unused. For example, a conductive path from node 1157 to node 1158 via line 1192 of switching circuit 1142 may be bypassed by a portion of segment 1173 (of line 1171) coupled to nodes 1157 and 1158, as shown in FIG. 11. Similarly, as shown in FIG. 11, the gates of switching circuit 1143 and the gates of switching circuit 1141 can be associated with the same signal BSEL1. As part of a process of forming the memory array, the gates of switching circuit 1143 can be coupled to respective gates of switching circuit 1141. Thus, although switching circuit 1143 may be present in memory device 1100, as shown in FIG. 11, switching circuit 1143 may be unused. For example, a conductive path from node 1155 to node 1156 via line 1193 of switching circuit 1143 may be bypassed by a portion of segment 1174 (of line 1170) coupled to nodes 1155 and 1156, as shown in FIG. 11.

Transistor 1188 and sense amplifier 1125 can correspond to and operate similarly to transistor 488 and sense amplifier 425, respectively, of FIG. 4. For example, during a read operation, transistor 1188 can transfer a signal from node 1166 through line 1144 to sense amplifier 1125. Then, sense amplifier 1125 is configured to determine the values of the signal on line 1144 that corresponds to the value of stored information associated with one or more selected memory cells of memory cell strings 1101, 1102, 1103, or 1104.

Figure 12:
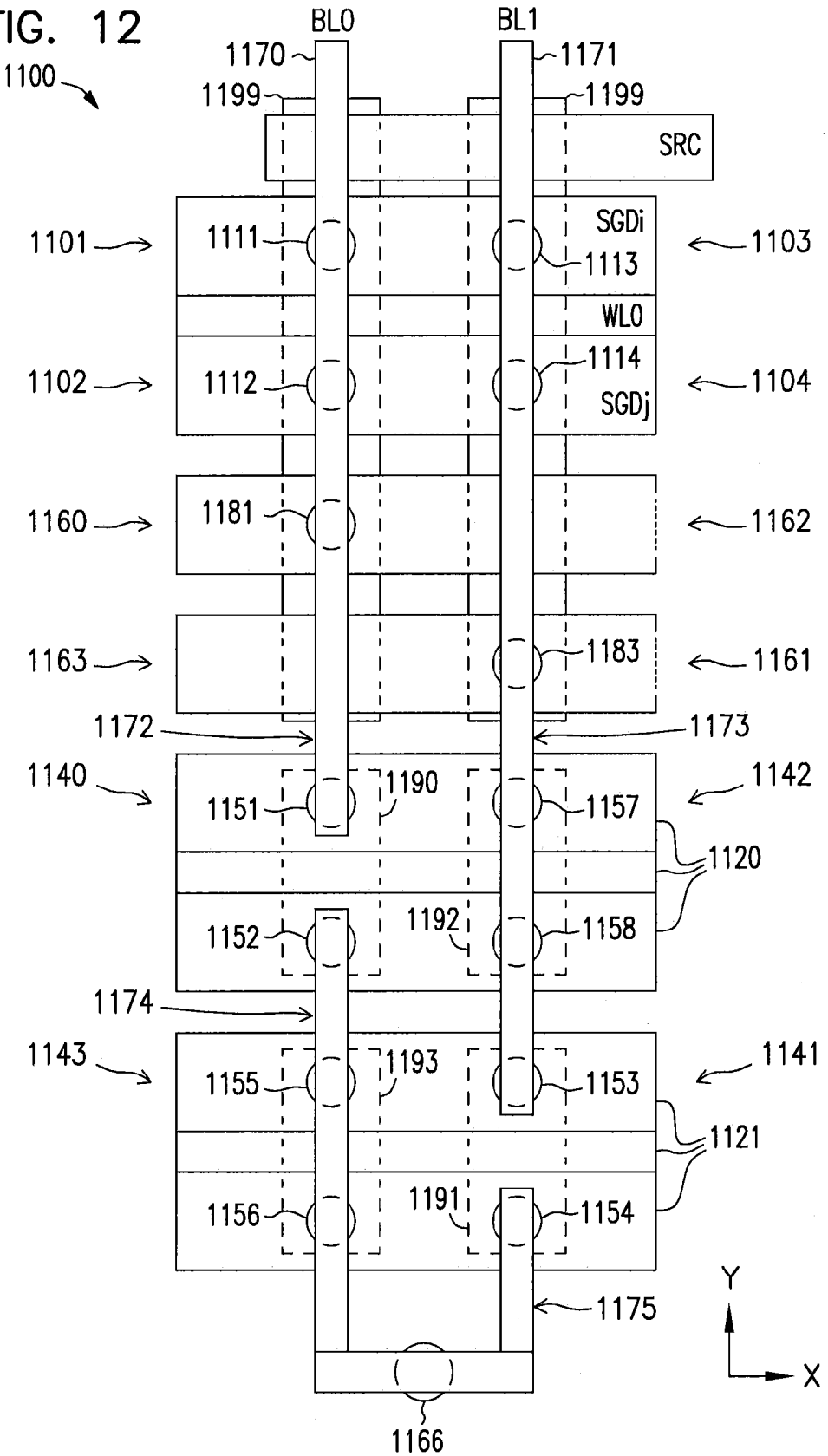
FIG. 12, FIG. 13, and FIG. 14 show different views of a structure of the memory device of FIG. 11, according to an embodiment of the invention.

FIG. 12 shows a top view of a structure of memory device 1100 of FIG. 11, according to an embodiment of the invention. For simplicity, detailed description of the same elements between FIG. 11 through FIG. 12 is not repeated in the description of FIG. 12. As shown in FIG. 12, line 1170 includes a length extending in a Y-direction, which is perpendicular (or substantially perpendicular) to an X-direction. Line 1171 includes a length extending in a Y-direction. Lines 1170 and 1171 can be parallel (or substantially parallel) with each other in the Y-direction.

The circles located along segments 1172 and 1174 of line 1170 (BL0) correspond to contacts at which nodes 1111, 1112, 1181, 1151, 1152, 1155, and 1156 are coupled to line 1170. The circles located along segments 1173 and 1175 of line 1171 (BL1) correspond to contacts at which nodes 1113, 1114, 1183, 1157, 1158, 1153, and 1154 are coupled to line 1171. Node 1166 is coupled to lines 1170 and 1171 at a contact where line 1170 joins line 1171.

No circle being shown along line 1170 at the location of bias circuit 1163 indicates that node 1185 (FIG. 11) is uncoupled to (e.g., does not contact) line 1170. No circle being shown along line 1171 at the location of bias circuit 1162 indicates that node 1186 (FIG. 11) is uncoupled to (e.g., does not contact) line 1171.

FIG. 12 also show lines 1190, 1191, 1192, and 1193 of switching circuits 1140, 1141, 1142, and 1143, respectively, being located underneath lines 1170 and 1171. As shown in FIG. 12, each of lines 1170 and 1171 has a length in the Y-direction. Each of lines 1190, 1191, 1192, and 1193 also has a length in Y-direction. Lines 1199 associated with memory cell strings 1101, 1102, 1103, and 1104 and bias circuits 1160, 1161, 1162, and 1163 can be seen as coupled to a line (associated with signal SRC) that extends in the X-direction. Since FIG. 12 shows a top view of memory device 1100, only some of the gates (e.g., gates associated with signals SGDi, SGDj, and WL0) of memory cell strings 1101, 1102, 1103, and 1104 may be seen in FIG. 12.

Figure 13:
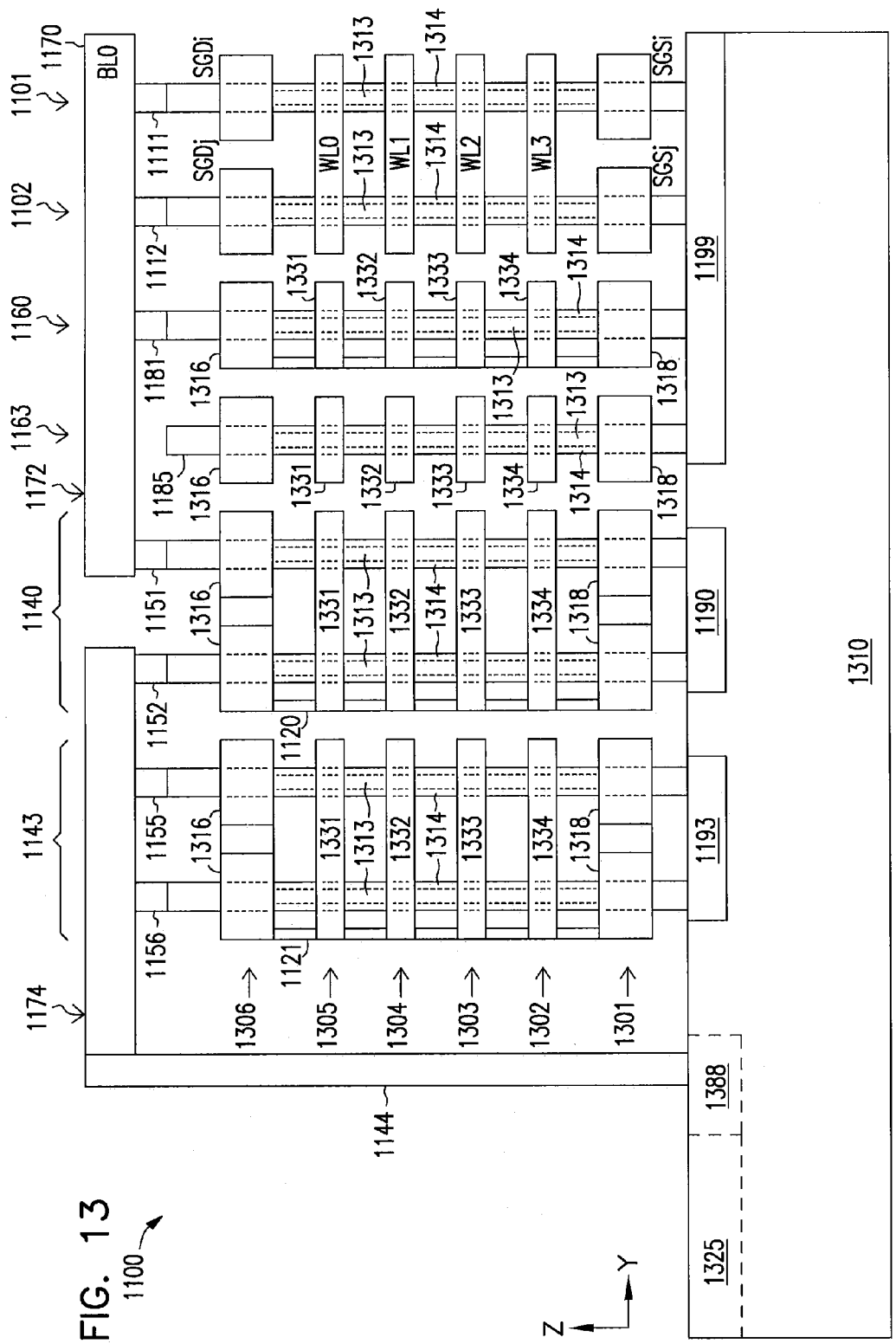

FIG. 13 shows a side view of a structure of memory device 1100 including line 1170 of FIG. 11, according to an embodiment of the invention. For simplicity, detailed description of the same elements among FIG. 11 through FIG. 13 is not repeated in the description of FIG. 13. As shown in FIG. 13, nodes 1111, 1112, 1181, 1151, 1152, 1155, and 1156 contact segments 1172 and 1174 of line 1170 at different contact locations. Node 1185 does not contact line 1170.

As shown in FIG. 13, memory device 1100 can include different device levels 1301, 1302, 1303, 1304, 1305, and 1306 in a Z-direction, which is perpendicular (or substantially perpendicular) to the Y-direction.

As described above with reference to FIG. 11, the functions of memory cell strings 1101 and 1102, bias circuits 1160 and 1163, and switching circuits 1140 and 1143 are different. However, memory cell strings 1101 and 1102, bias circuits 1160 and 1163, and switching circuits 1140 and 1143 can be formed in the same processing steps (e.g., formed at the same time and using the same materials). Thus, memory cell strings 1101 and 1102, bias circuits 1160 and 1163, and switching circuits 1140 and 1143 can have substantially the same structure and materials, as described below.

As shown in FIG. 13, each of memory cell strings 1101 and 1102 includes a body region 1313 having a length in the Z-direction and six gates located along the length of body region 1313. For example, memory cell string 1101 has six gates associated with signals SGDi, WL0, WL1, WL2, WL3, and SGSi, respectively, in which each of these gates is located at a different device level among device levels 1301 through 1306. Memory cell string 1102 has six gates associated with signals SGDj, WL0, WL1, WL2, WL3, and SGSj, respectively, in which each of these gates is located at a different device level among device levels 1301 through 1306.

Each of memory cell strings 1101 and 1102 also includes a material 1314 between body region 1313 and the gates associated with signals WL0, WL1, WL2, and WL3. Material 1314 can substantially surround body region 1313. Each of gates associated with signals WL0, WL1, WL2, and WL3 can substantially surround a respective cross section of body region 1313. The cross section of body region 1313 can have a circular shape. Body region 1313 can include semiconductor material, such as silicon (e.g., doped polysilicon of p-type or n-type).

Material 1314 can include material that can be configured to store information in memory cells of memory cell strings 1101 and 1102. For example, material 1314 can include charge storage material, such as a combination of a tunnel dielectric layer, a silicon oxide layer, and a charge blocking layer, or a combination of a silicon nitride layer, a polysilicon layer, and a nitride layer, or other material that can provide a charge storage function to represent a value of information stored in the memory cells of memory cell strings 1101 and 1102. As an example, material 1314 can include a combination of a tunnel dielectric directly contacting the body region 1313, a charge storage material (e.g., polysilicon floating gate) directly contacting the tunnel dielectric, and a charge blocking material directly contacting the charge storage material.

FIG. 13 shows an example of four memory cells in each of memory cell strings 1101 and 1102. Each of the four memory cells can store information (e.g., in form of a charge) in a respective a portion of material 1134 near a respective gate (the gate associated with WL0, WL1, WL2, or WL3). Thus, in each of memory cell strings 1101 and 1102, at least a portion of material 1314 (e.g., a portion of material at near each of the gates associated with WL0, WL1, WL2, or WL3) can be configured to store information.

Each of bias circuits 1160 and 1163 includes structure and material at least substantially similar to those of memory cell strings 1101 and 1102, including body region 1313 and material 1314. For example, as shown in FIG. 13, each of bias circuit 1160 and 1163 includes six gates 1316, 1318, 1331, 1332, 1333, and 1334 located along the length of body region 1313. As shown in FIG. 13, gates 1316, 1318, 1331, 1332, 1333, and 1334 of bias circuit 1160 are separated from gates 1316, 1318, 1331, 1332, 1333, and 1334 of bias circuit 1163. Each of these gates is located at a different device level among device levels 1301 through 1306.

Each of bias circuits 1160 and 1163 also includes material 1314 between body region 1313 and the gates 1331, 1332, 1333, and 1334. Material 1314 in bias circuits 1160 and 1163 can be identical (or substantially identical) to material 1314 in memory cell strings 1101 and 1102. Alternatively, material 1314 in bias circuits 1160 and 1163 can be different from material 1314 in memory cell strings 1101 and 1102. However, material 1314 in bias circuits 1160 and 1163 may not be configured to store information. Thus, in each of bias circuits 1160 and 1163, none of portions of material 1314 (including portions of material 1314 near gates 1331, 1332, 1333, and 1334) may be configured to store information.

Each of switching circuits 1140 and 1143 includes structure and material at least substantially similar to those of memory cell strings 1101 and 1102, including body region 1313 and material 1314. For example, as shown in FIG. 13, each of switching circuits 1140 and 1143 includes six gates 1316, 1318, 1331, 1332, 1333, and 1334 located along the length of two different body regions 1313. Each of these gates is located at a different device level among device levels 1301 through 1306. Gates 1316, 1318, 1331, 1332, 1333, and 1334 of switching circuit 1140 are separated from gates 1316, 1318, 1331, 1332, 1333, and 1334 of switching circuit 1143.

Gates 1316, 1318, 1331, 1332, 1333, and 1334 of switching circuit 1140 can be coupled together by line 1120. Gates 1316, 1318, 1331, 1332, 1333, and 1334 of switching circuit 1143 can be coupled together by line 1121. Lines 1120 and 1121 can be structured as conductive lines and can include a conductive material, such as doped polysilicon, metal, or other conductive material.

In FIG. 13 and in other figures (e.g., FIG. 14, FIG. 17, FIG. 18, FIG. 24, FIG. 25, FIG. 28, and FIG. 29), the structures of lines 1120 and 1121 associated with switching circuits 1140 and 1143 (and 1142 and 1141 in FIG. 14) are example structures. Other structures of lines 1120 and 1121 can be formed. The structures of the lines coupled the gates (e.g., 1331, 1332, 1333, and 1334 in FIG. 13) of bias circuit 1160 together (e.g., in FIG. 13) and couple the gates (e.g., 1331, 1332, 1333, and 1334 in FIG. 14) of bias circuit 1161 together are also example structures. Other structures can be formed.

Each of switching circuits 1140 and 1143 also includes material 1314 between each of the two body regions 1313 and the gates 1331, 1332, 1333, and 1334. Material 1314 in switching circuits 1140 and 1143 can be identical (or substantially identical) to material 1314 in memory cell strings 1101 and 1102. Alternatively, material 1314 in switching circuits 1140 and 1143 can be different from material 1314 in memory cell strings 1101 and 1102. However, material 1314 in switching circuits 1140 and 1143 may not be configured to store information. Thus, in each switching circuits 1140 and 1143, none of portions of material 1314 (including portions of material 1314 near gates 1331, 1332, 1333, and 1334) may be configured to store information. In a memory operation (e.g., a read or programming operation), a combination of line 1190, body region 1313 between node 1151 and line 1190, and body region 1313 between node 1152 and line 1190, can form a conductive path and couple segment 1172 of line 1170 to segment 1174 of line 1170. Such a conductive path can correspond to conductive path 590 of FIG. 5, FIG. 6, and FIG. 7.

Memory device 1100 can include a substrate 1310, which can include a semiconductor material, such as silicon. As shown in FIG. 13, memory cell strings 1101 and 1102, bias circuits 1160 and 1163, and switching circuits 1140 and 1141 are overlying substrate 1310. Lines 1190, 1193, and 1199 are separated from each other. FIG. 13 shows lines 1190, 1193, and 1199 (also shown in FIG. 11 and FIG. 12) being formed in substrate 1310 (e.g., as a conductively doped region of the substrate or as a conductive material formed in a trench formed in the substrate 1310) as an example. Lines 1190, 1193, and 1199 can be formed over substrate 1310. Lines 1190, 1193, and 1199 can include a conductive material, such as doped polysilicon, metal, or other conductive material.

As shown in FIG. 13, each of lines 1190, 1193, and 1199 can be coupled to respective body regions 1313 of switching circuits 1140 and 1143, bias circuits 1160 and 1163, and memory cell strings 1101, and 1102. Lines 1190, 1193, and 1199 and body regions 1313 can be formed of an identical material, for example, doped polysilicon of p-type or n-type.

Substrate 1310 includes substrate portions 1325 and 1388. Sense amplifier 1125 (FIG. 11) can be formed in substrate portion 1325. Transistor 1188 (FIG. 11) can be formed in portion 1388. For example, source and drain of transistor 1188 can be formed in portion 1388, in which the source (or drain) of transistor 1188 can be coupled to sense amplifier 1125 (in substrate portion 1325) and the drain (or source) of transistor 1188 can be coupled to line 1144.

Thus, as shown in FIG. 13, memory cell strings 1101 and 1102, bias circuits 1160 and 1163, and switching circuits 1140 and 1143 can be formed in device levels (e.g., levels over substrate 1310) of memory device 1100 that are different from the device level (e.g., a level in substrate 1310) at which sense amplifier 1125 and transistor 1188 are formed.

In an alternative arrangement, bias circuits 1160 and 1163 can be formed in substrate 1310 at which sense amplifier 1125 and transistor 1188 are formed. In this alternative arrangement, memory cell strings 1101 and 1102, and switching circuits 1140 and 1143 can be formed in device levels (e.g., levels over substrate 1310) of memory device 1100 that are different from the device level (or device levels) in substrate 1310 at which bias circuits 1160 and 1163, sense amplifier 1125 and transistor 1188 are formed.

In another alternative arrangement, switching circuits 1140 and 1143 can be formed in substrate 1310 at which sense amplifier 1125 and transistor 1188 are formed. In this alternative arrangement, memory cell strings 1101 and 1102, and bias circuits 1160 and 1163 can be formed in device levels (e.g., levels over substrate 1310) of memory device 1100 that are different from the device level (or device levels) in substrate 1310 at which switching circuits 1140 and 1143, sense amplifier 1125 and transistor 1188 are formed.

Figure 14:
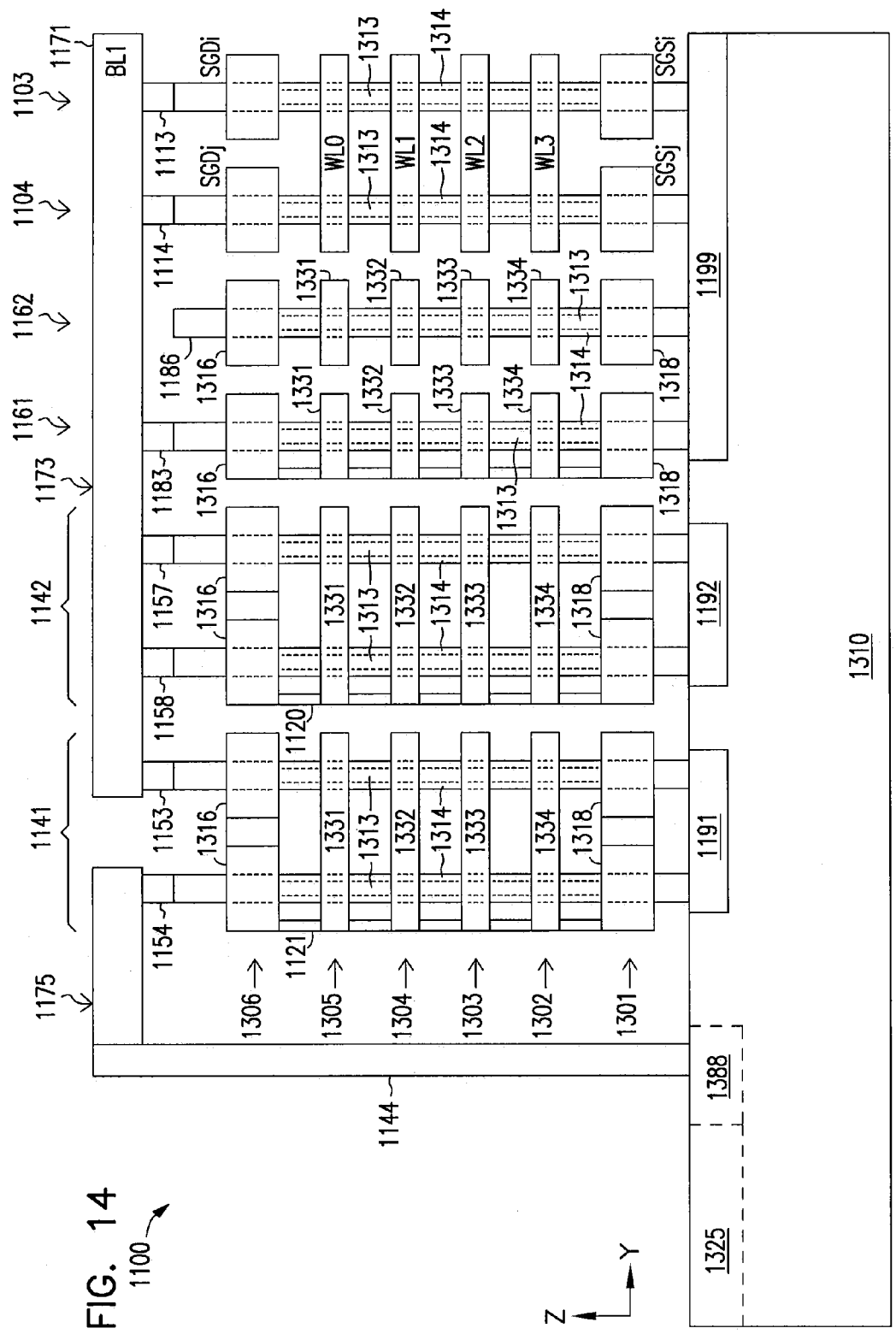

FIG. 14 shows a side view of a structure of memory device 1100 including line 1171 of FIG. 11, according to an embodiment of the invention. As shown in FIG. 14, line 1171, memory cell strings 1103 and 1104, bias circuits 1161 and 1162, and switching circuits 1141 and 1142 can have structures similar to those of line 1170, memory cell strings 1101 and 1102, bias circuits 1160 and 1163, and switching circuits 1140 and 1143, respectively, of FIG. 13. For simplicity, detailed description of the same elements among FIG. 11 through FIG. 14 is not repeated in the description of FIG. 14.

As shown in FIG. 14, nodes 1113, 1114, 1183, 1157, 1158, 1153, and 1154 contact segments 1173 and 1175 of line 1171 at different contact locations. Node 1186 does not contact line 1171. Lines 1191, 1192, and 1199 are separated from each other. FIG. 13 shows lines 1190, 1193, and 1199 (also shown in FIG. 11 and FIG. 12) being formed in substrate 1310 as an example. Lines 1191, 1192, and 1199 can be formed over substrate 1310. Lines 1191, 1192, and 1199 can be formed of a material similar to that of line 1190, 1193, and 1199 of FIG. 13.

In a memory operation (e.g., a read or programming operation), a combination of line 1191, body region 1313 between node 1153 and line 1191, and body region 1313 between node 1154 and line 1191, can form a conductive path and couple segment 1173 of line 1171 to segment 1175 of line 1171. Such a conductive path can correspond to conductive path 591 of FIG. 5, FIG. 6, and FIG. 7.

Thus, as shown in FIG. 14, memory cell strings 1103 and 1104, bias circuits 1161 and 1162, and switching circuits 1141 and 1142 can be formed in device levels (e.g., levels over substrate 1310) of memory device 1100 that are different from the device level (e.g., a level in substrate 1310) at which sense amplifier 1125 and transistor 1188 are formed.

In an alternative arrangement, bias circuits 1161 and 1162 can be formed in substrate 1310 at which sense amplifier 1125 and transistor 1188 are formed. In this alternative arrangement, memory cell strings 1103 and 1104, and switching circuits 1141 and 1142 can be formed in device levels (e.g., levels over substrate 1310) of memory device 1100 that are different from the device level (or device levels) in substrate 1310 at which bias circuits 1161 and 1162, sense amplifier 1125 and transistor 1188 are formed.

In another alternative arrangement, switching circuits 1141 and 1142 can be formed in substrate 1310 at which sense amplifier 1125 and transistor 1188 are formed. In this alternative arrangement, memory cell strings 1103 and 1104, and bias circuits 1161 and 1162 can be formed in device levels (e.g., levels over substrate 1310) of memory device 1100 that are different from the device level (or device levels) in substrate 1310 at which switching circuits 1141 and 1142, sense amplifier 1125 and transistor 1188 are formed.

Figure 15:
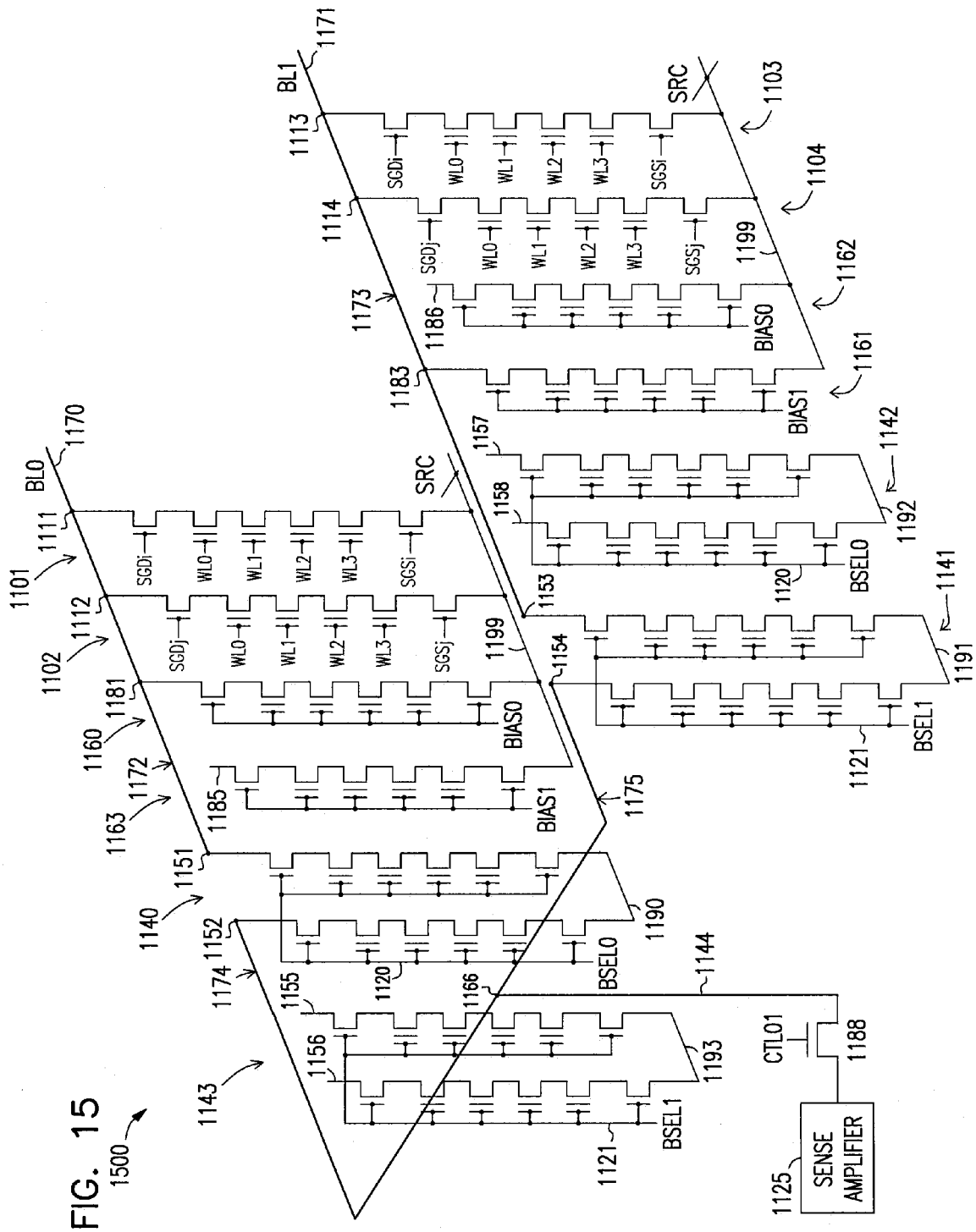
FIG. 15 shows a schematic diagram of a portion of a memory device having switching circuits uncoupled to data lines, according to an embodiment of the invention.

FIG. 15 shows a schematic diagram of a portion of a memory device 1500 having switching circuits 1142 and 1143 uncoupled to lines 1171 and 1170, according to an embodiment of the invention. Memory device 1500 can be a variation of memory device 1100 of FIG. 11. For example, memory device 1500 shown in FIG. 15 through FIG. 18 can be the same as memory device 1100 shown in FIG. 11 through FIG. 14, except for the connections of switching circuits 1142 and 1143 to lines 1171 and 1170, respectively, in FIG. 15 through FIG. 18. The same elements in FIG. 11 through FIG.

18 are given the same designation labels. For simplicity, detailed description and operation of the same elements in FIG. 11 through FIG. 18 is not repeated in the description of FIG. 15 through FIG. 18.

As described above with reference to FIG. 11, switching circuits 1142 and 1143 may be unused. Thus, in FIG. 15, nodes 1157 and 1158 of switching circuit 1142 can be uncoupled to line 1171. Nodes 1155 and 1156 of switching circuit 1143 can be uncoupled to line 1170.

Figure 16:
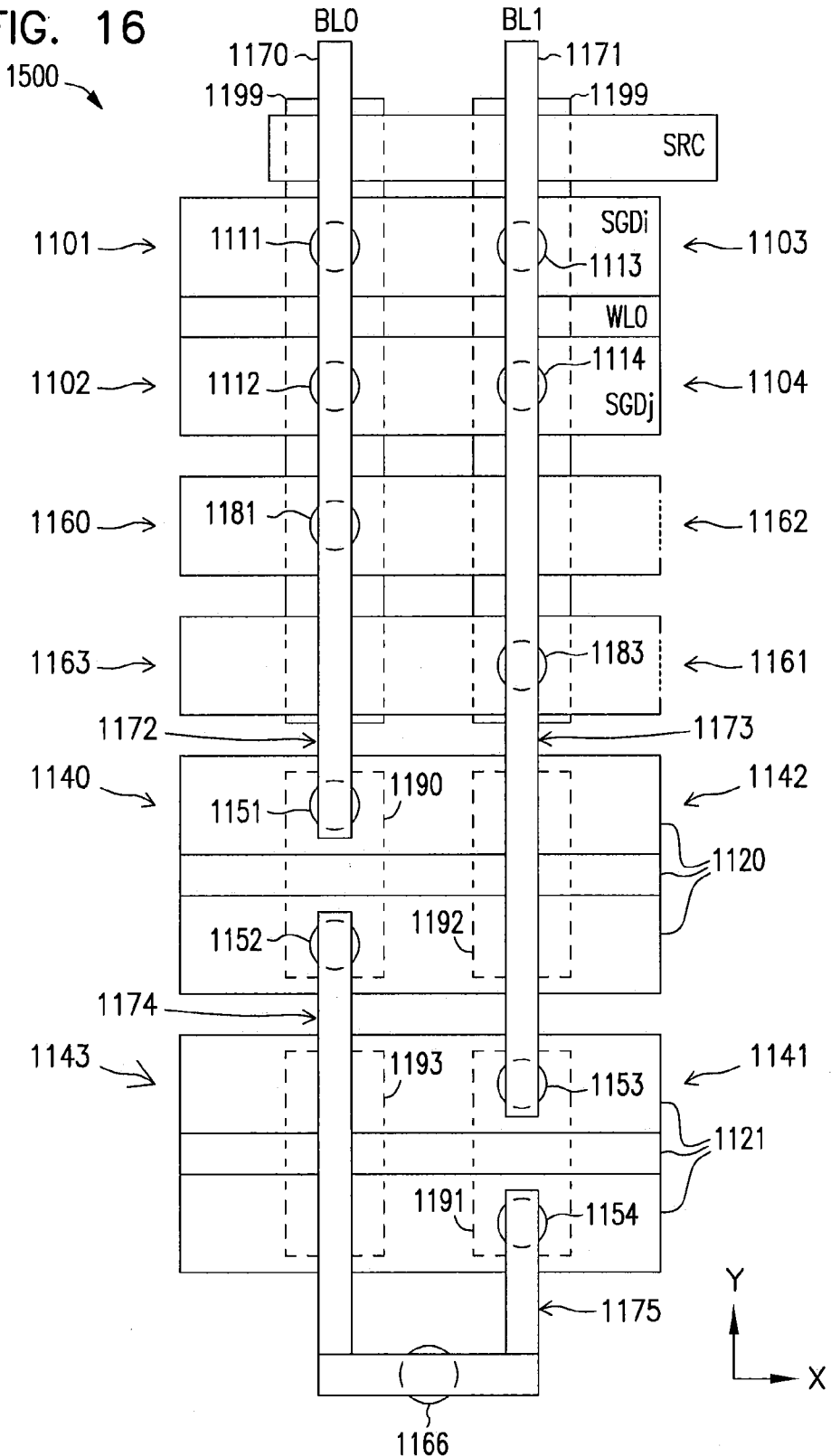
FIG. 16, FIG. 17, and FIG. 18 show different views of a structure of a structure of the memory device of FIG. 11, according to an embodiment of the invention.

FIG. 16 shows a top view of a structure of memory device 1500 of FIG. 15, according to an embodiment of the invention. The top view of memory device 1500 can be the same as the top view of memory device 1100 in FIG. 12, except for the connections of switching circuits 1142 and 1143 in FIG. 16. In FIG. 16, no circles being shown along line 1170 at the location of switching circuits 1143 indicates that nodes 1155 and 1156 (FIG. 15) are uncoupled to (e.g., do not contact) line 1170. No circles are shown along line 1171 at the location of switching circuits 1142 indicates that nodes 1153, and 1154 (FIG. 15) are uncoupled to (e.g., do not contact) line 1171.

Figure 17:
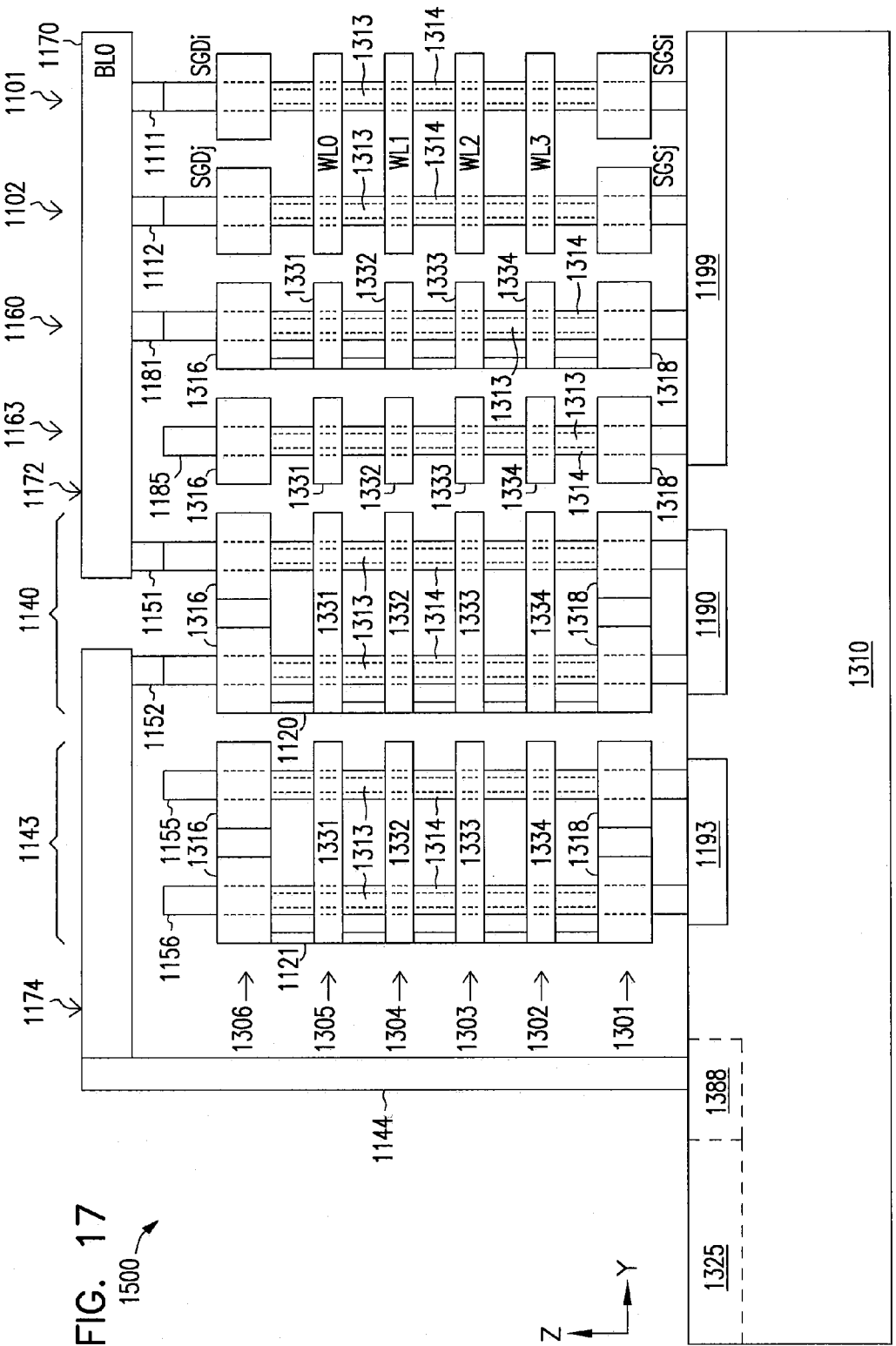

FIG. 17 shows a side view of a structure of memory device 1500 including line 1170 of FIG. 15, according to an embodiment of the invention. The side view of memory device 1500 can be the same as the side view of memory device 1100 in FIG. 13, except for the connections of switching circuit 1143 in FIG. 17. As shown in FIG. 17, nodes 1155 and 1156 of switching circuit 1143 do not contact line 1170.

Figure 18:
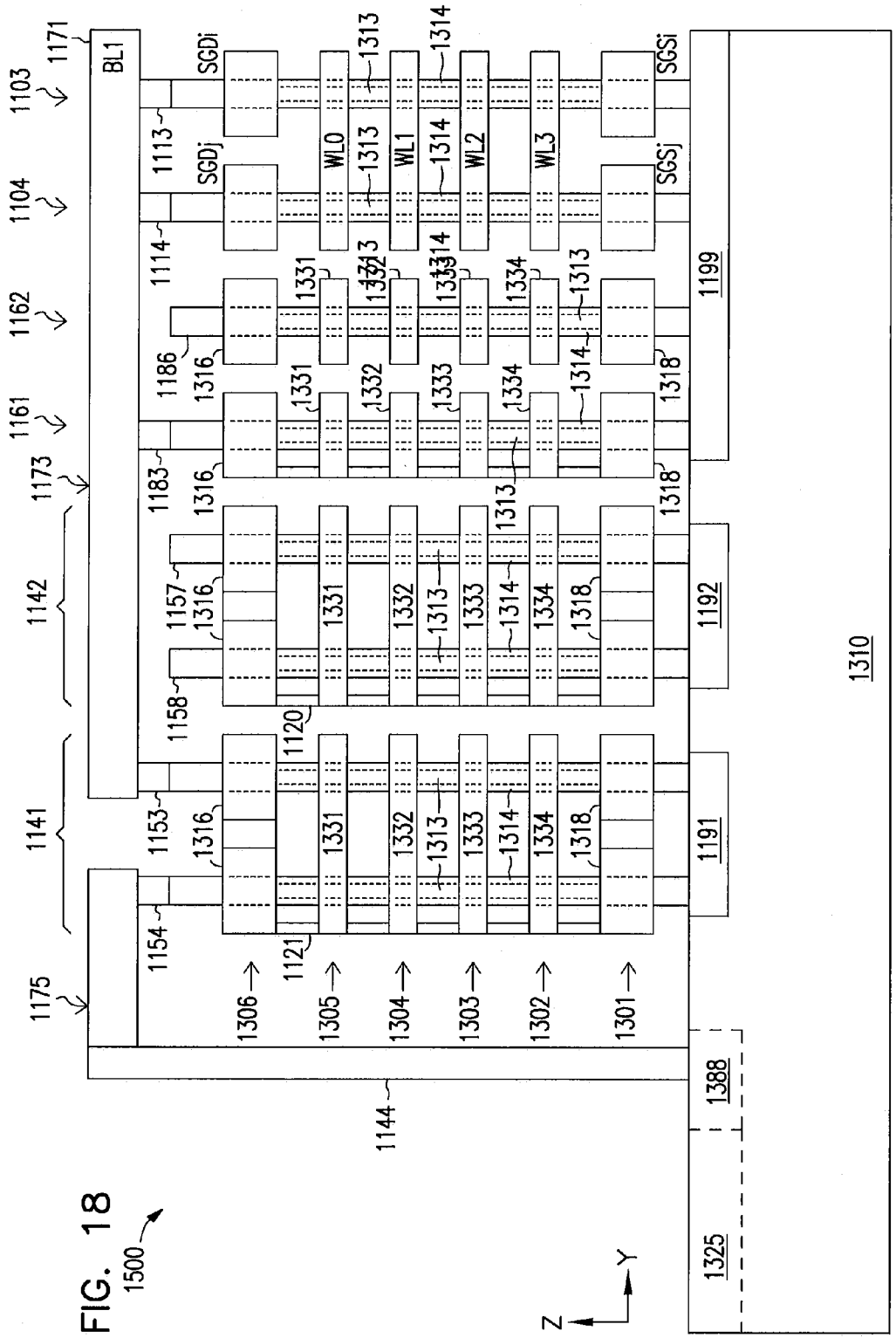

FIG. 18 shows a side view of a structure of memory device 1500 including line 1171 of FIG. 15, according to an embodiment of the invention. The side view of memory device 1500 can be the same as the side view of memory device 1100 of FIG. 14, except for the connections of switching circuit 1142 in FIG. 18. As shown in FIG. 18, nodes 1157 and 1158 of switching circuit 1142 do not contact line 1171.

Figure 19:
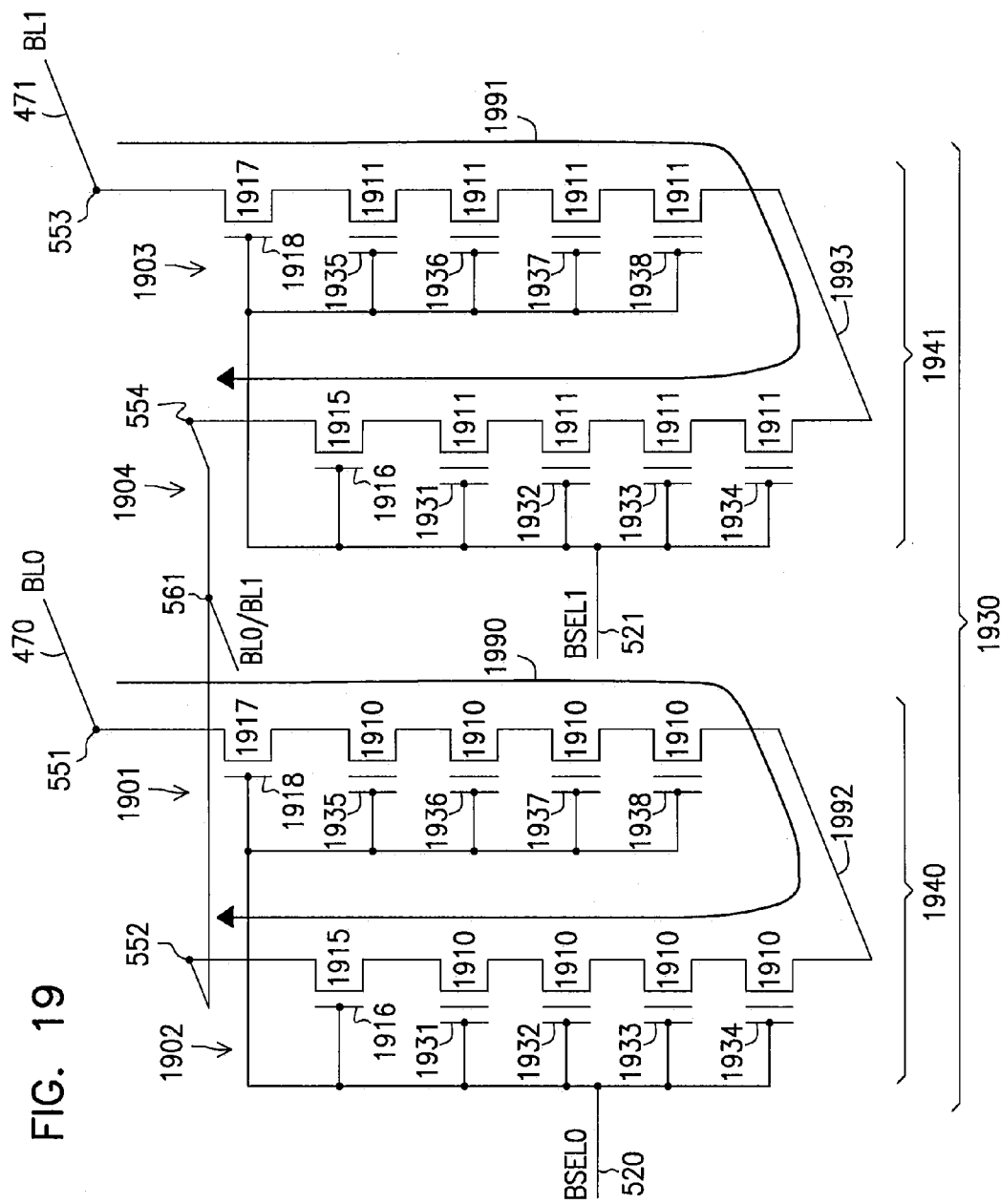
FIG. 19 shows a schematic diagram of switching circuits of another multiplexer, according to an embodiment of the invention.

FIG. 19 shows a schematic diagram of a multiplexer 1930, according to an embodiment of the invention. Multiplexer 1930 can be part of a memory device, such as memory device 400 of FIG. 4. For example, multiplexer 1930 can correspond to multiplexer 431 of FIG. 4 and FIG. 6. Similar elements in FIG. 6 and FIG. 19 are given the same designation labels. For simplicity, detailed description and operation of the same elements in FIG. 6 and FIG. 19 is not repeated in the description of FIG. 19. Multiplexer 1930 is configured to selectively couple line 470 to node 561 through a conductive path 1990 and couple line 471 to node 561 through a conductive path 1991. As shown in FIG. 19, each of conductive paths 1990 and 1991 can physically be a U-shaped conductive path. Conductive paths 1990 and 1991 can correspond to conductive paths 590 and 591, respectively, of FIG. 6.

Multiplexer 1930 can include switching circuits 1940 and 1941 having elements arranged in a fashion similar to that of two of memory cell strings 301, 302, 303, and 304 of FIG. 3. For example, each of switching circuits 1940 and 1941 can include transistors 1915 and 1917 having associated gates 1916 and 1918 and elements having associated gates 1931, 1932, 1933, 1934, 1935, 1936, 1937, and 1938. Elements 1910 and 1911 can have a structure similar to or identical to that of memory cells, such as memory cells 310 or 311 of FIG. 3. However, in FIG. 19, elements 1910 and 1911 may not be configured to store information. Instead, elements 1910 and 1911 may be configured to operate as pass elements (e.g., transistors) to form a portion of conductive path 1990 or a portion of conductive path 1991.

As shown in FIG. 19, switching circuit 1940 can include portions 1901 and 1902. Conductive path 1990 includes a combination of a path formed by transistor 1917 and elements 1910 of portion 1901, a path formed by transistor 1915 and elements 1910 in portion 1902, and a path formed by line 1992. Line 1992 can include a conductive line having conductive material, such as doped polysilicon, metal, or other conductive material.

Switching circuit 1941 can include portions 1903 and 1904. Conductive path 1991 includes a combination of a path formed by transistor 1917 and elements 1911 of portion 1903, a path formed by transistor 1915 and elements 1911 in portion 1904, and a path formed by line 1993. Line 1993 can include a conductive line having conductive material, such as doped polysilicon, metal, or other conductive material.

In switching circuit 1940, gates 1916, 1918, and 1931 through 1938 can be coupled to line 520 to receive the same signal BSEL0. In switching circuit 1941, gates 1916, 1918, and 1931 through 1938 can be coupled to line 521 to receive the same signal BSEL1. In a memory operation (e.g., a read or programming operation), switching circuit 1940 can respond to signal BSEL0 to form conductive path 1990 between nodes 551 and 552. Switching circuit 1941 can respond to signal BSEL0 to form conductive path 1991 between nodes 553 and 554.

The values (e.g., voltage values) of signals BSEL0 and BSEL1 in FIG. 19 during read, programming, and erase operations can be the same as those shown in Table 1.

Figure 20:
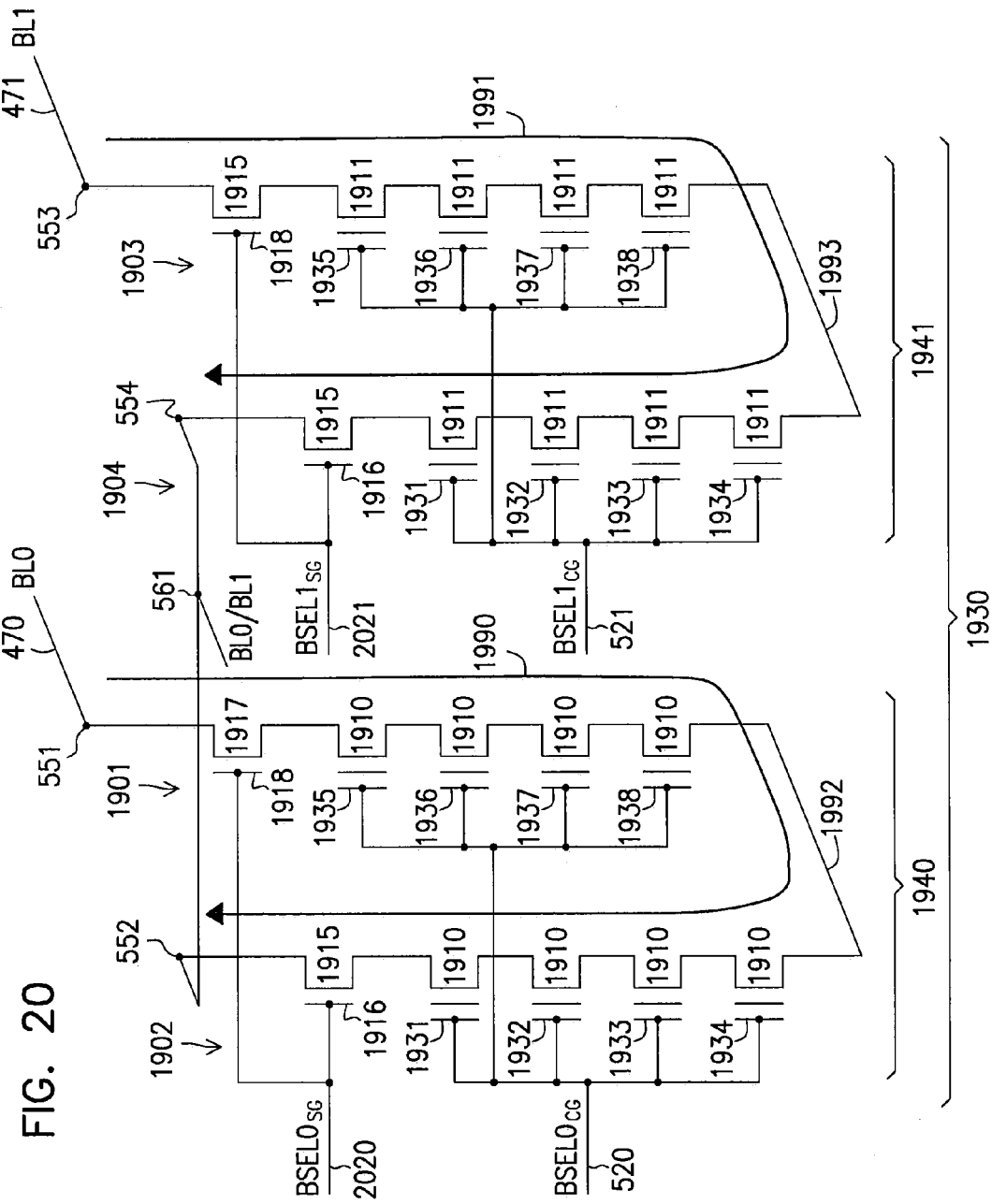
FIG. 20 shows a schematic diagram of the switching circuits of FIG. 19 with separate gates in each of the switching circuits, according to an embodiment of the invention.

FIG. 20 shows a schematic diagram of switching circuits 1940 and 1941 of FIG. 19 with separate gates in each of switching circuits 1940 and 1941, according to an embodiment of the invention. Switching circuits 1940 and 1941 in FIG. 20 can be a variation of switching circuits 1940 and 1941 of FIG. 19.

As shown in FIG. 20, the gates of switching circuit 1940 can be divided into two groups, one group having gates 1916 and 1918 coupled to a line 2020 and another group having gates 1931 through 1938 coupled to line 520. Lines 520 and 2020 can receive different signals $BSEL0_{SG}$ and $BSEL0_{CG}$, respectively. The gates of switching circuit 1941 can be divided into two groups, with one group having gates 1916 and 1918 coupled to a line 2021 and another group having gates 1931 through 1938 coupled to line 521. Lines 2021 and 521 can receive different signals $BSEL1_{SG}$ and $BSEL1_{CG}$, respectively.

The values (e.g., voltage values) of signals $BSEL0_{SG}$, $BSEL0_{CG}$, $BSEL1_{SG}$, and $BSEL1_{CG}$ in FIG. 20 during initialization, read, programming, and erase operations can be the same as those shown in Table 2.

Figure 21A:
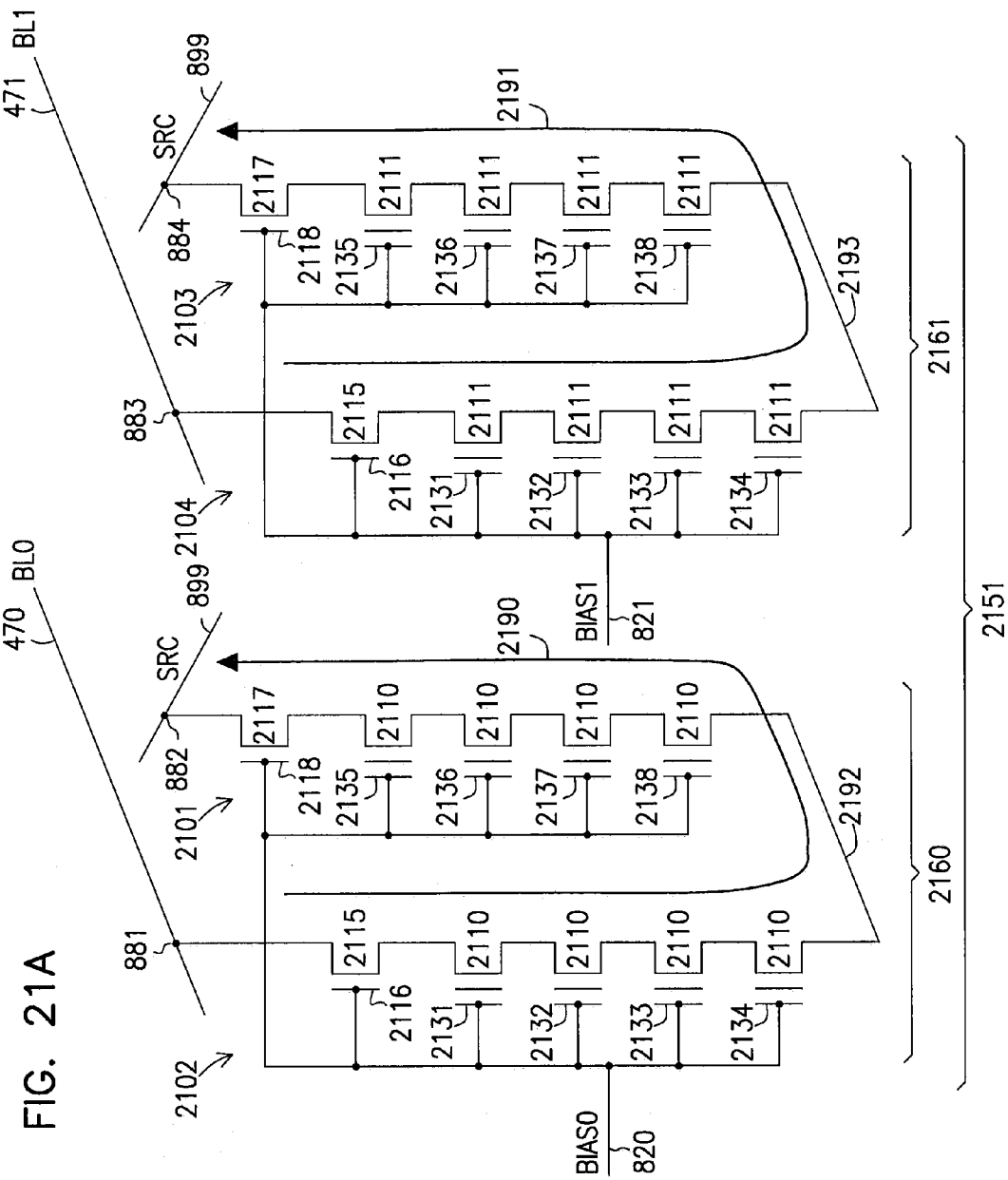
FIG. 21A and FIG. 21B shows a schematic diagram of another bias unit, according to an embodiment of the invention.

FIG. 21A shows a schematic diagram of bias unit 2151, according to an embodiment of the invention. Bias unit 2151 can be part of a memory device, such as memory device 400 of FIG. 4. For example, bias unit 2151 can correspond to bias unit 451 of FIG. 4 and FIG. 9A. Similar elements in FIG. 9A and FIG. 21A are given the same designation labels. For simplicity, detailed description and operation of the same elements in FIG. 9A and FIG. 21A is not repeated in the description of FIG. 21A. Bias unit 2151 is configured to selectively couple line 470 to line 899 (associated with signal SRC) through a conductive path 2190 and couple line 471 to line 899 through a conductive path 2191. As shown in FIG. 21A, each of conductive paths 2190 and 2191 can physically be a U-shaped conductive path. Conductive paths 2190 and 2191 can correspond to conductive paths 890 and 891, respectively, of FIG. 9A.

Bias unit 2151 can include bias circuits 2160 and 2161 having elements arranged in a fashion similar to that of two of memory cell strings 301, 302, 303, and 304 of FIG. 3. For example, each of bias circuits 2160 and 2161 can include transistors 2115 and 2117 having associated gates 2116 and 2118 and elements having associated gates 2131, 2132, 2133, 2134, 2135, 2136, 2137, and 2138. Elements 2110 and 2111 can have a structure similar to or identical to that of memory cells, such as memory cells 310 or 311 of FIG. 3. However, in FIG. 21A, elements 2110 and 2111 may not be configured to store information. Instead, elements 2110 and 2111 may be configured to operate as pass elements (e.g., transistors) to form a portion of conductive path 2190 or a portion of conductive path 2191.

As shown in FIG. 21A, bias circuit 2160 can include portions 2101 and 2102. Conductive path 2190 includes a combination of a path formed by transistor 2117 and elements 2110 of portion 2101, a path formed by transistor 2115 and elements 2110 in portion 2102, and a path formed by line 2192. Line 2192 can include a conductive line having conductive material, such as doped polysilicon, metal, or other conductive material.

As shown in FIG. 21A, bias circuit 2161 can include portions 2103 and 2104. Conductive path 2191 includes a combination of a path formed by transistor 2117 and elements 2111 of portion 2103, a path formed by transistor 2115 and elements 2111 in portion 2104, and a path formed by line 2193. Line 2193 can include a conductive line having conductive material, such as doped polysilicon, metal, or other conductive material.

In bias circuit 2160, gates 2116, 2118, and 2131 through 2138 can be coupled to line 820 to receive the same signal BIAS0. In bias circuit 2161, gates 2116, 2118, and 2131 through 2138 can be coupled to line 821 to receive the same signal BIAS1. In a memory operation (e.g., a read or programming operation), bias circuit 2160 can respond to signal BIAS0 to form conductive path 2190 between nodes 881 and 882 and couple line 470 to node 882. Bias circuit 2161 can respond to signal BIAS0 to form conductive path 2191 between nodes 883 and 884 and couple line 471 to node 884. Signal SRC associated with the lines coupled to nodes 882 and 884 can be provided with different voltage values, such as zero volts and approximately two volts during read and programming operations, respectively, if line 470 (or line 471) is unselected.

The values (e.g., voltage values) of signals BIAS0 and BIAS1 in FIG. 21A during read, programming, and erase operations can be the same as those shown in Table 3.

Figure 21B:
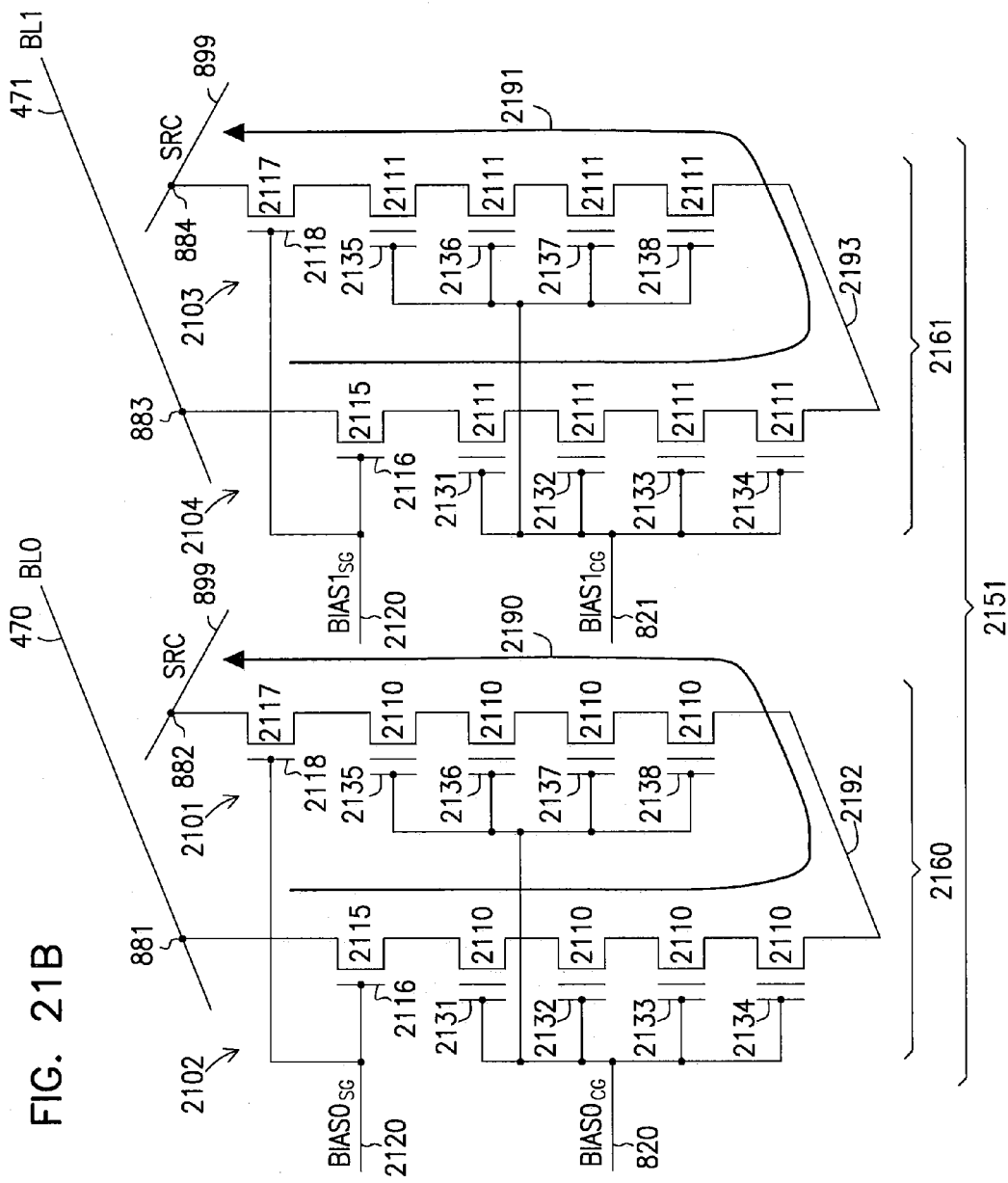

FIG. 21B shows a schematic diagram of bias circuits 2160 and 2161 of FIG. 8 with separate gates in each of bias circuits 2160 and 2161, according to an embodiment of the invention. Bias circuits 2160 and 2161 in FIG. 21B can be a variation of bias circuits 2160 and 2161 of FIG. 21A.

As shown in FIG. 21B, the gates of bias circuit 2160 can be divided into two groups, one group having gates 2116 and 2118 coupled to a line 2120 and another group having gates 2131 through 2138 coupled to line 820. Lines 2120 and 820 can receive different signals $BIAS0_{SG}$ and $BIAS0_{CG}$, respectively. The gates of bias circuit 2161 can be divided into two groups, with one group having gates 2116 and 2118 coupled to a line 2121 and another group having gates 2131 through 2138 coupled to line 821. Lines 2121 and 821 can receive different signals $BIAS1_{SG}$ and $BIAS1_{CG}$, respectively.

The values (e.g., voltage values) of signals $BSEL0_{SG}$, $BSEL0_{CG}$, $BSEL1_{SG}$, and $BSEL1_{CG}$ in FIG. 21B during initialization, read, programming, and erase operations can be the same as those shown in Table 4.

Figure 22:
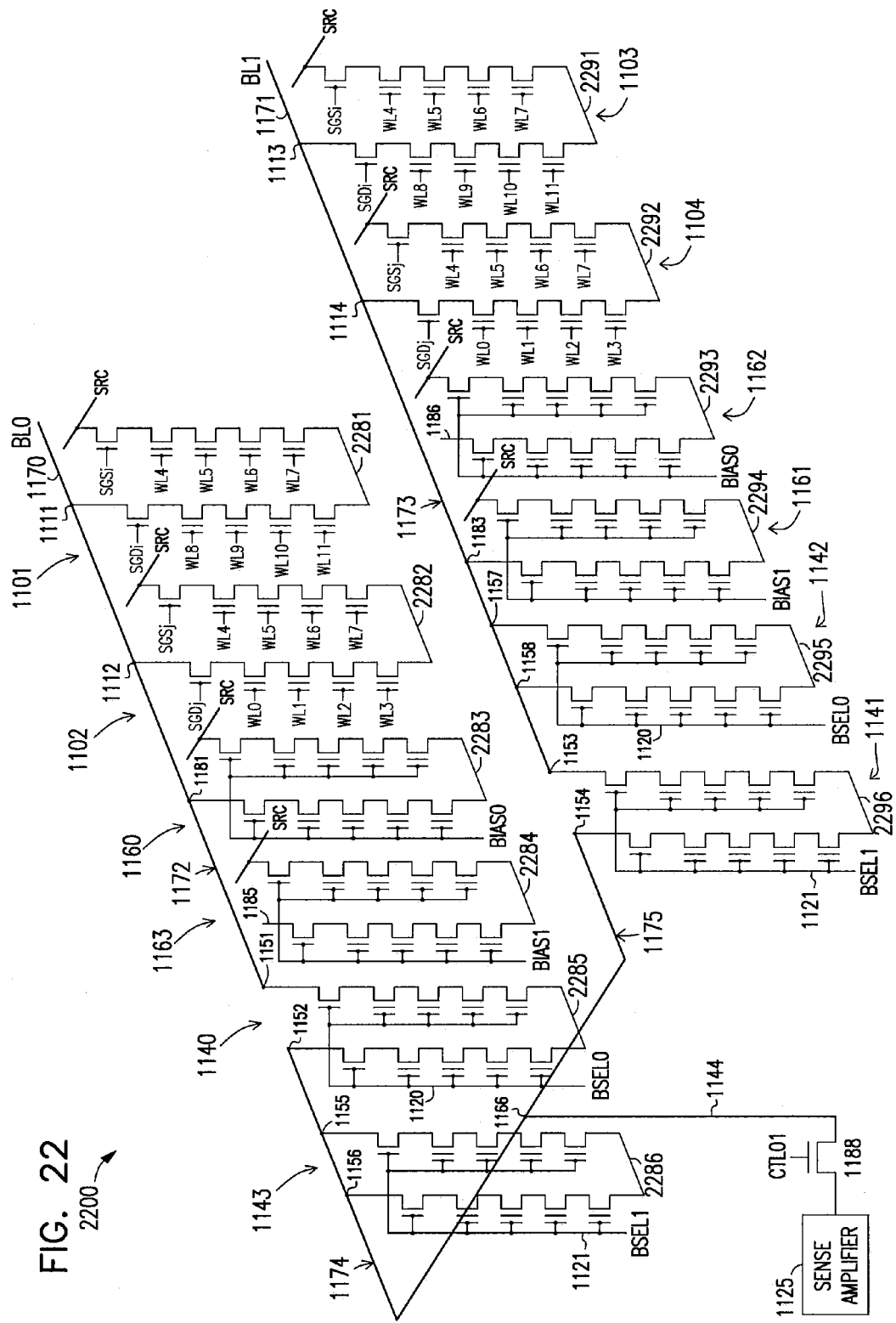
FIG. 22 shows a schematic diagram of a portion of another memory device, according to an embodiment of the invention.

FIG. 22 shows a schematic diagram of a portion of a memory device 2200, according to an embodiment of the invention. Memory device can be a variation of memory device 1100 of FIG. 11. Similar elements in FIG. 11 and FIG. 22 are given the same designation labels. For simplicity, detailed description and operation of the same elements in FIG. 6 and FIG. 19 is not repeated in the description of FIG. 19. The operation of memory device 2200 can be similar to that of memory device 1100.

In FIG. 22, memory cell strings 1101, 1102, 1103, and 1104 and associated signals SGDi, SGDj, SGSi, SGSj, WL4, WL5, WL6, WL7, WL8, WL9, WL10, and WL11 can correspond to those of memory cell strings 301, 302, 303, and 304 and the same signals shown in FIG. 3.

Bias circuits 1160 and 1161 can correspond to and operate similarly to bias circuits 2160 and 2161, respectively, of FIG. 21A and FIG. 21B. Bias circuits 1162 and 1163 may be unused.

Switching circuits 1140 and 1141 can correspond to and operate similarly to switching circuits 1940 and 1941, respectively, of FIG. 19. Switching circuits 1142 and 1143 in FIG. 22 may be unused.

As shown in FIG. 22, memory device 2200 can include separate conductive lines 2281 through 2286 and 2291 through 2296 associated memory cell strings 1101, 1102, 1103, and 1104, bias circuits 1160, 1161, 1162, and 1163, and switching circuits 1140, 1141, 1142, and 1143. These conductive lines can include conductive material, such as doped polysilicon, metal, or other conductive material.

Transistor 1188 and sense amplifier 1125 can correspond to and operate similarly to transistor 488 and sense amplifier 425, respectively, of FIG. 4 and FIG. 11.

Figure 23:
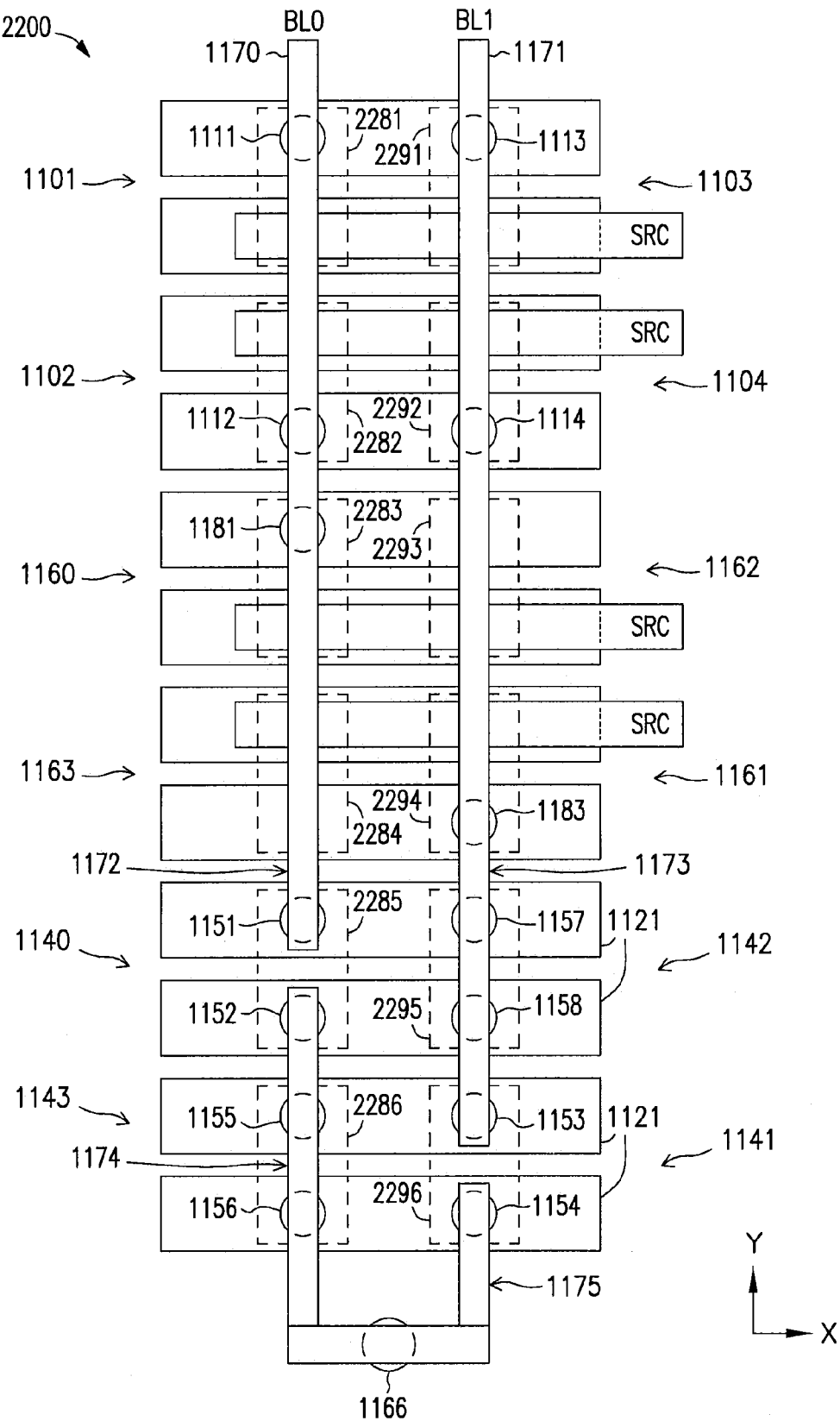
FIG. 23, FIG. 24, and FIG. 25 show different views of a structure of the memory device of FIG. 22, according to an embodiment of the invention.
Figure 24:
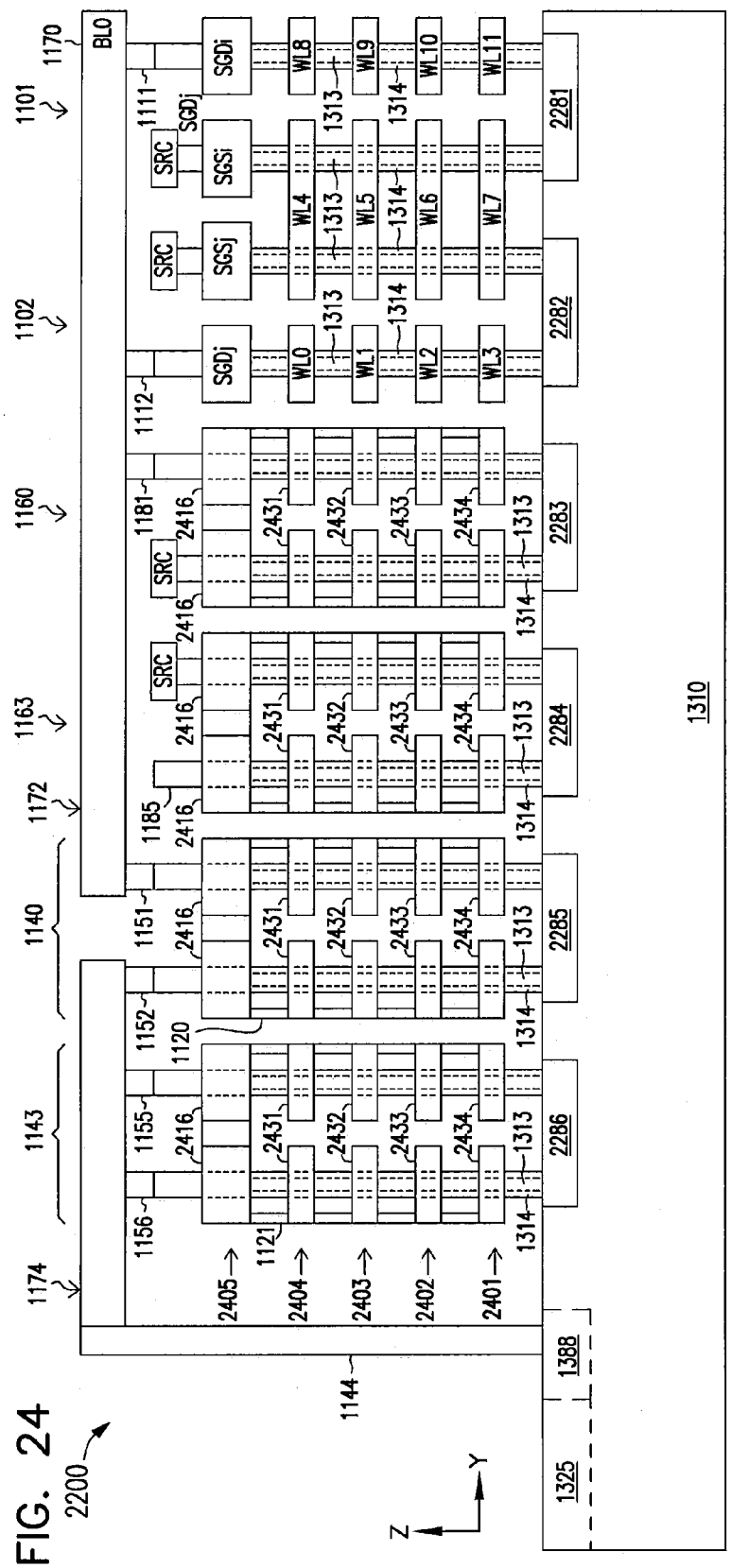
Figure 25:
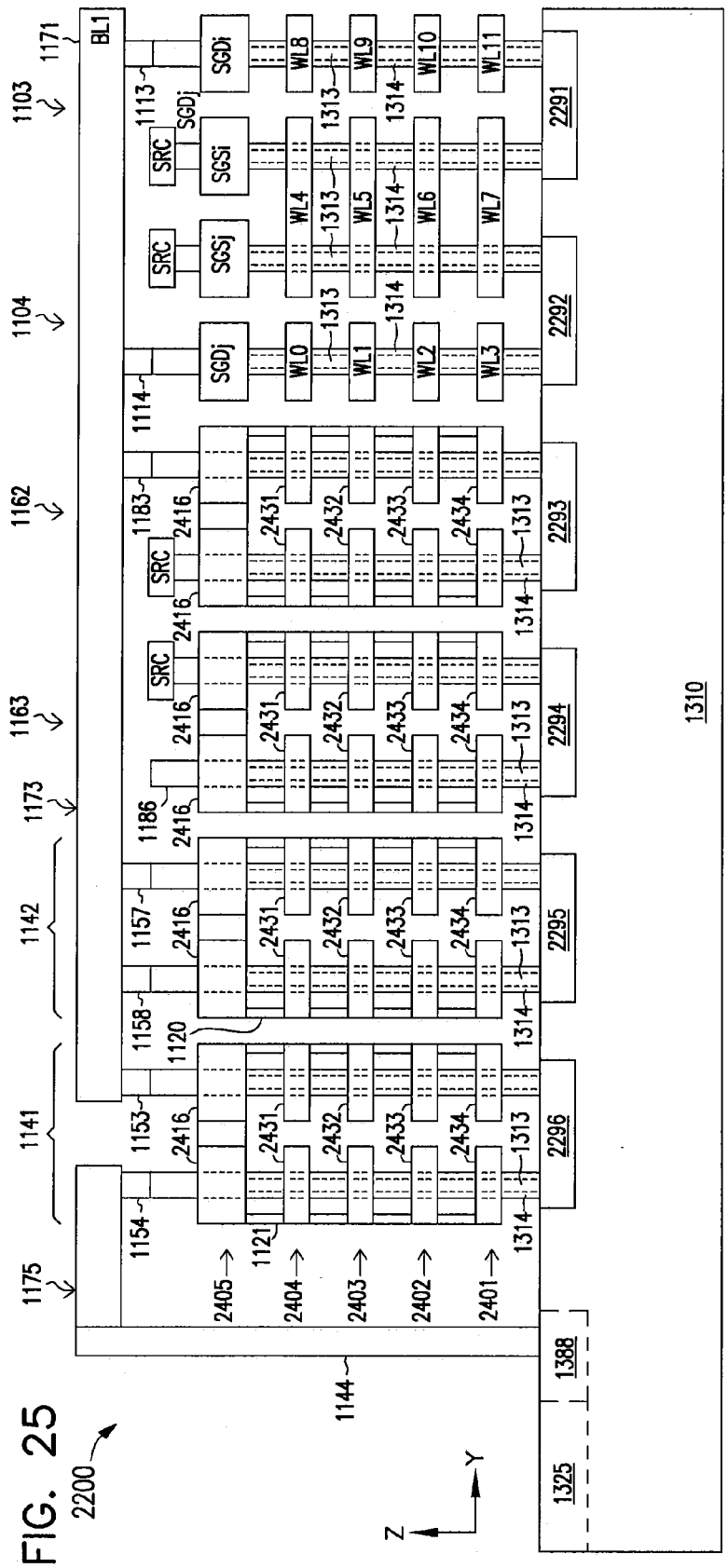

FIG. 23, FIG. 24, and FIG. 25 show top and side views of a structure of memory device 2200 of FIG. 22, according to an embodiment of the invention. The top and side views in FIG. 23, FIG. 24, and FIG. 25 can correspond to those of FIG. 12, FIG. 13, and FIG. 14. For simplicity, detailed description and operation of the same elements in FIG. 12, FIG. 13, and FIG. 14 and FIG. 23, FIG. 24, and FIG. 25 is not repeated in the description of FIG. 23, FIG. 24, and FIG. 25.

As shown in FIG. 23, lines associated with signals SRC has as length in the X-direction. Each of lines 1170 and 1171 has a length in the Y-direction. Thus, the lines associated with signals SRC can be substantially perpendicular to lines 1170 and 1171. Each of conductive lines 2281 through 2286 and 2291 through 2296 also has a length in Y-direction.

As shown in FIG. 24, memory device 2200 can include device levels 2401, 2402, 2403, 2404, and 2405. Gates 2416, 2431, 2432, 2433, and 2434 of bias circuits 1160 and 1163 and switching circuits 1140 and 1143 can be located along body region 1313. In each of bias circuits 1160 and 1163 and switching circuits 1140 and 1143, gates 2416, 2431, 2432, 2433, and 2434 can be coupled to each other. Memory cell strings 1101 and 1102 can share the same gates associated with signals WL4, WL5, WL6, and WL7. Conductive lines 2281 through 2286 can be formed in or above substrate 1310. Lines associated with signals SRC can be formed above the memory cells of memory cell strings 1101 and 1102 and below line 1170.

In a memory operation (e.g., a read or programming operation), a combination of line 2285, body region 1313 between node 1151 and line 2285, and body region 1313 between node 1152 and line 2285, can form a conductive path and couple segment 1172 of line 1170 to segment 1174 of line 1170. Such a conductive path can correspond to conductive path 590 of FIG. 5 or can correspond to conductive path 1990 of FIG. 19 and FIG. 20.

FIG. 25 show a side view of memory device 2200, including line 1171. Conductive lines 2291 through 2296 can be formed in or above substrate 1310. Lines associated with signals SRC can be formed above the memory cells of memory cell strings 1103 and 1104 and below line 1171. In a memory operation (e.g., a read or programming operation), a combination of line 2296, body region 1313 between node 1153 and line 2296, and body region 1313 between node 1154 and line 2296, can form a conductive path and couple segment 1173 of line 1171 to segment 1175 of line 1171. Such a conductive path can correspond to conductive path 591 of FIG. 5 or can correspond to conductive path 1991 of FIG. 19 and FIG. 20.

As shown in FIG. 22 through FIG. 25, memory cell strings 1101, 1102, 1103, and 1104, bias circuits 1160, 1161, 1162, and 1163, and switching circuits 1140, 1141, 1142, and 1143, and can be formed in device levels (e.g., levels over substrate 1310) of memory device 1100 that are different from the device level (e.g., a level in substrate 1310) at which sense amplifier 1125 and transistor 1188 are formed. In an alternative arrangement, either a combination of bias circuits 1160, 1161, 1162, and 1163 or a combination of switching circuits 1140, 1141, 1142, and 1143 can be formed in substrate 1310 (FIG. 24 and FIG. 25) at which sense amplifier 1125 and transistor 1188 are formed.

Figure 26:
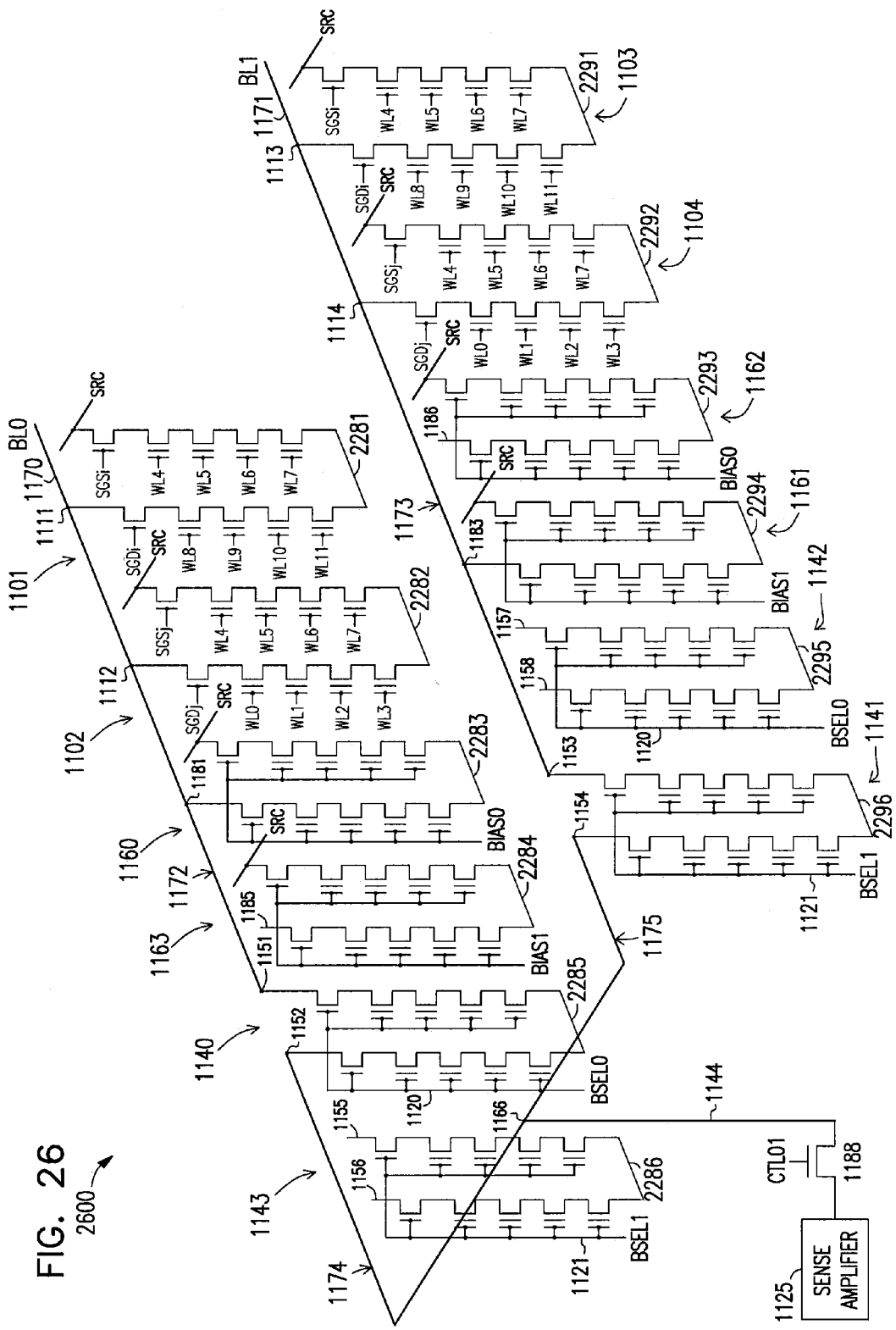
FIG. 26 shows a schematic diagram of a portion of another memory device having switching circuits uncoupled to data lines, according to an embodiment of the invention.

FIG. 26 shows a schematic diagram of a portion of a memory device 2600 having switching circuits 1142 and 1143 uncoupled to lines 1171 and 1170, according to an embodiment of the invention. Memory device 2600 is the same as memory device 2200 of FIG. 22, except for the connections from switching circuits 1142 and 1143 to lines 1171 and 1170, respectively. Thus, memory device 2600 can be a variation of memory device 2200 of FIG. 22.

Figure 27:
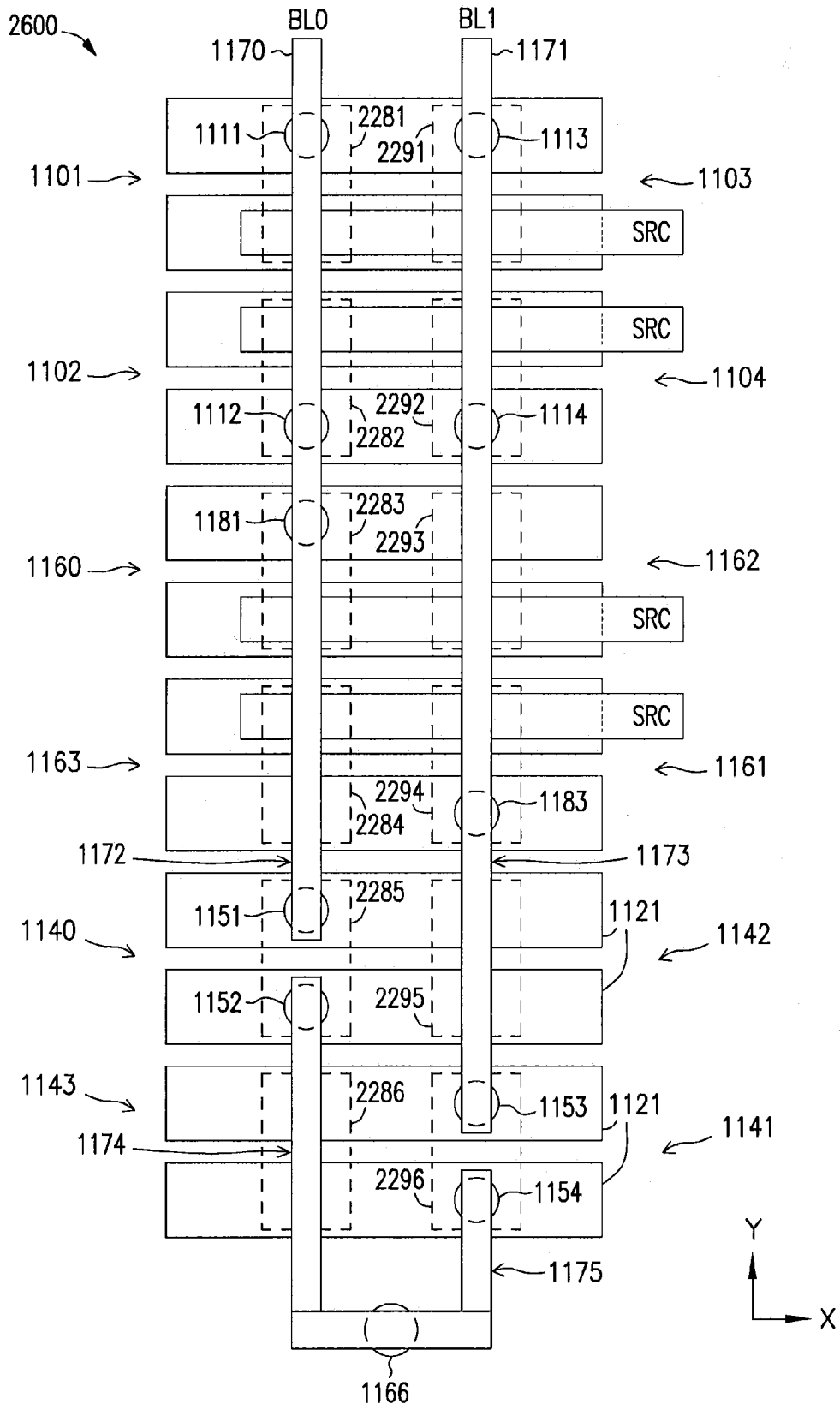
FIG. 27, FIG. 28, and FIG. 29 show different views of a structure of the memory device of FIG. 26, according to an embodiment of the invention.
Figure 28:
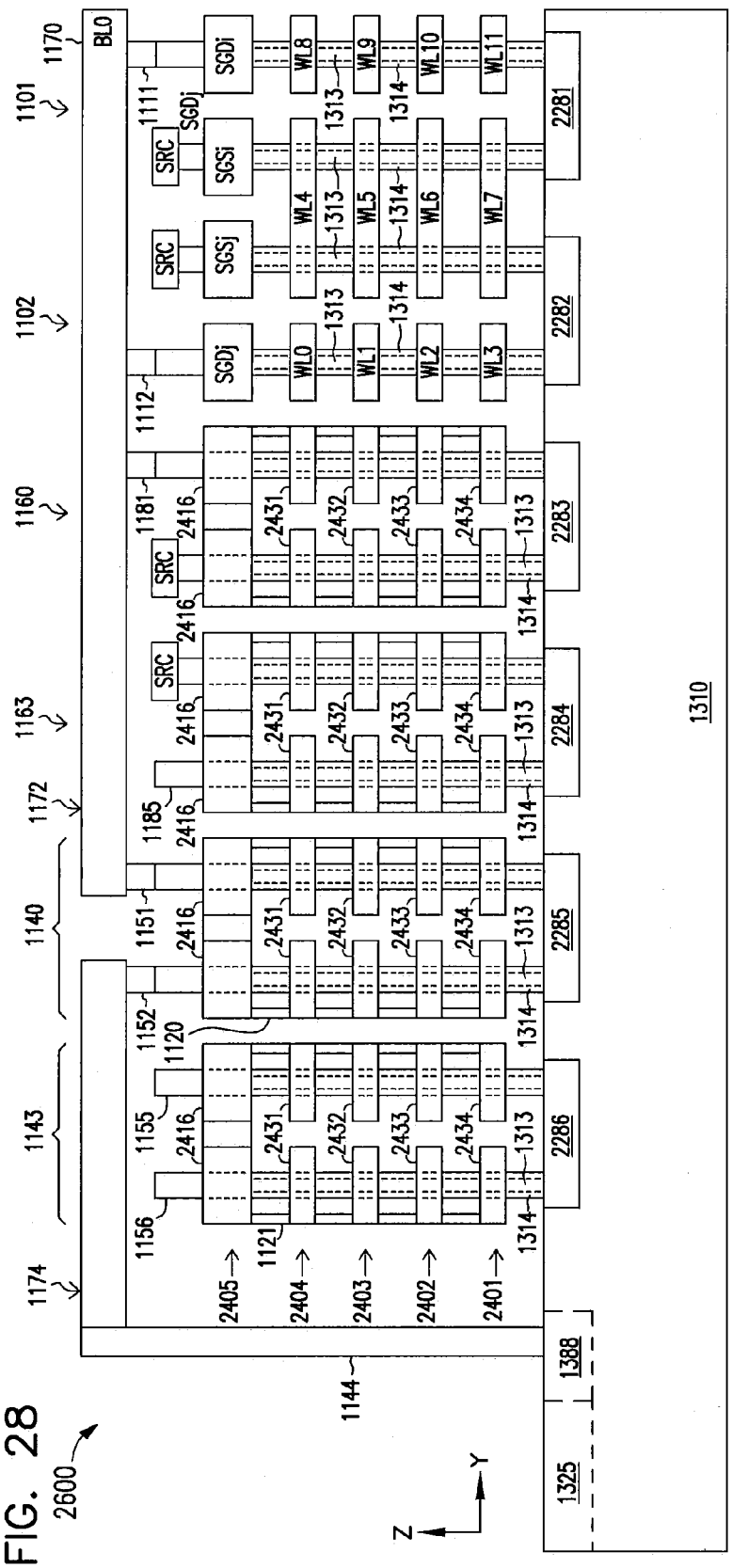
Figure 29:
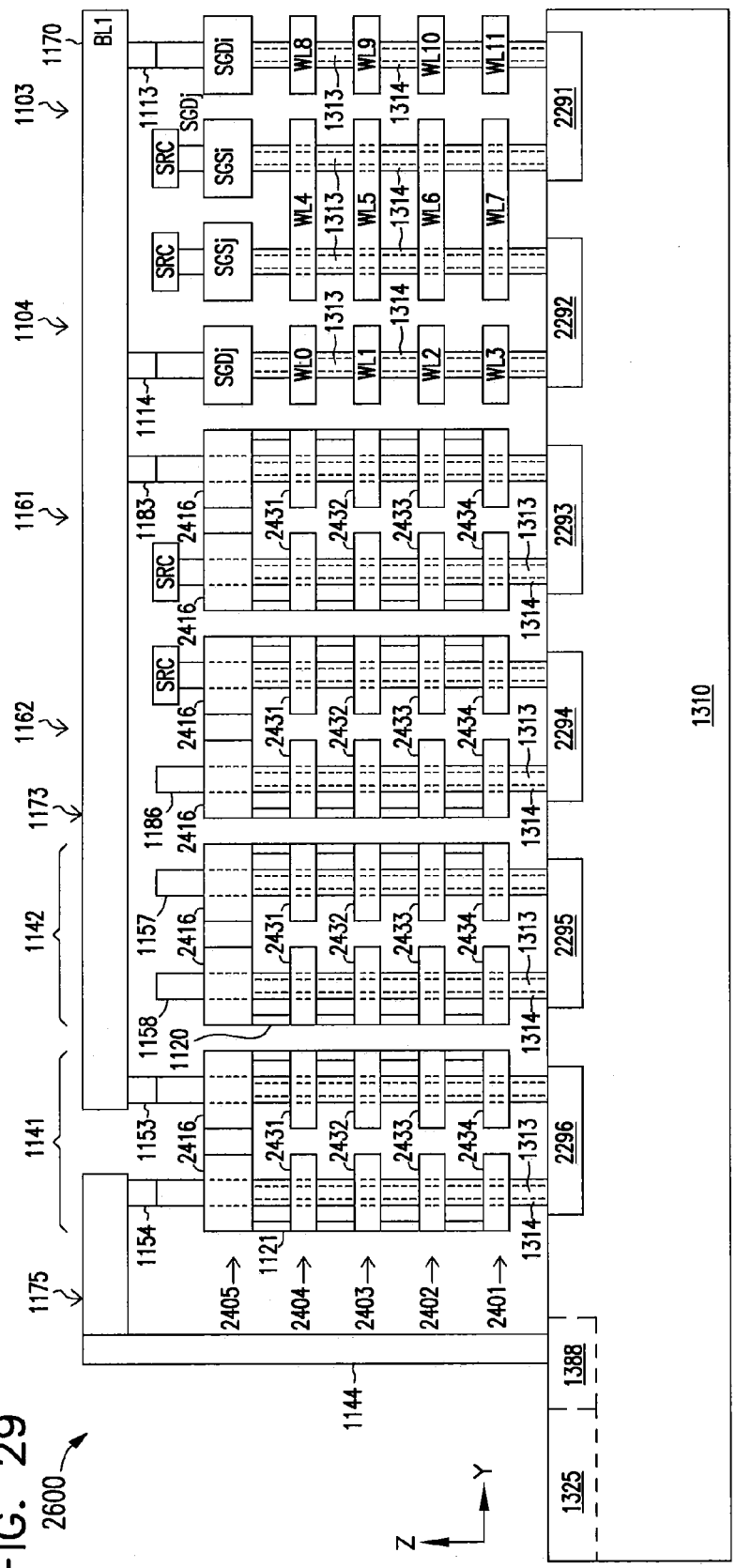

FIG. 27, FIG. 28, and FIG. 29 show top and side views of a structure of memory device 2600 of FIG. 26, according to an embodiment of the invention. The top and side views in FIG. 27, FIG. 28, and FIG. 29 can correspond to those of FIG. 16, FIG. 17, and FIG. 18, and FIG. 23, FIG. 24, and FIG. 25. For simplicity, detailed description and operation of the same elements in FIG. 16, FIG. 17, and FIG. 18 is not repeated in the description of FIG. 27, FIG. 28, and FIG. 29.

As shown in FIG. 27 and FIG. 28, nodes 1155 and 1156 (FIG. 28) of switching circuits 1143 are uncoupled to line 1170. As shown in FIG. 27 and FIG. 29 nodes 1157 and 1158 (FIG. 29) of switching circuits 1142 are uncoupled to line 1171.

The illustrations of apparatus (e.g., memory devices 100, 200, 300, 400, 1100, 1500, 2200, and 2600) are intended to provide a general understanding of the structure of various embodiments and are not intended to provide a complete description of all the elements and features of apparatus that might make use of the structures described herein. An apparatus herein refers to, for example, either a device (e.g., memory devices 100, 200, 300, 400, 1100, 1500, 2200, and 2600) or a system (e.g., a computer, a cellular phone, or other electronic system) that includes a device such as memory devices 100, 200, 300, 400, 1100, 1500, 2200, and 2600.

Any of the elements described above with reference to FIG. 1 through FIG. 29 can be implemented in a number of ways, including simulation via software. Thus, apparatus (e.g., memory devices 100, 200, 300, 400, 1100, 1500, 2200, and 2600) described above may all be characterized as "modules" (or "module") herein. Such modules may include hardware circuitry, single and/or multi-processor circuits, memory circuits, software program modules and objects and/or firmware, and combinations thereof, as desired by the architect of the apparatus (e.g., memory device 100, 200, 300, 400, 1100, 1500, 2200, and 2600) and as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 300, 400, 1100, 1500, 2200, and 2600 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatus may further be included as sub-elements within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 29 include apparatus and methods having data lines coupled to memory cell strings and a selector configured to selectively couple the data lines to a node. The memory cell strings can be formed from the same memory array of a device. Other embodiments including additional apparatus and methods are described. Such apparatus and methods described herein may improve memory operations (e.g., read, programming, and erase operations) or reduce device area, or both, of a memory device, such as memory devices 100, 200, 300, 400, 1100, 1500, 2200, and 2600.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
    data lines;
    a node; and
    a memory array including a first portion and a second portion, the first portion including memory cell strings coupled to the data lines, the second portion including a selector configured to selectively couple the data lines to the node, wherein the node is coupled to reference voltage wherein the memory cell strings comprise U-shaped strings.

2. An apparatus comprising:
    data lines;
    a node;
    a memory array including a first portion and a second portion, the first portion including memory cell strings coupled to the data lines, the second portion including a selector configured to selectively couple the data lines to the node; and
    a substrate, wherein the selector includes a first transistor overlying the substrate and a second transistor overlying the first transistor.

3. An apparatus comprising:
    data lines;
    a node;
    a memory array including a first portion and a second portion, the first portion including memory cell strings coupled to the data lines, the second portion including a selector configured to selectively couple the data lines to the node; and a substrate, wherein the selector includes a first gate overlying the substrate and a second gate overlying the first gate.

4. An apparatus comprising:

data lines;

a node;

a memory array including a first portion and a second portion, the first portion including memory cell strings coupled to the data lines, the second portion including a selector configured to selectively couple the data lines to the node;

a sense circuit configured to receive a signal from the node; and a transistor, wherein the transistor includes a first node coupled to the node and a second node coupled to the sense circuit.

5. The apparatus of claim 4, wherein the transistor is configured to operate at a voltage greater than a supply voltage of the memory array.

6. An apparatus comprising:

data lines;

a node; and a memory array including a first portion and a second portion, the first portion including memory cell strings coupled to the data lines, the second portion including a selector configured to selectively couple the data lines to the node, wherein the selector includes a bias unit configured to couple the data lines to different voltages in different memory operations.

7. The apparatus of claim 6, wherein the bias unit includes a separate bias unit for each of the data lines.

8. The apparatus of claim 6, wherein the bias unit includes a same bias unit for each of the data lines.

9. An apparatus comprising:

a substrate;

a data line overlying the substrate;

a first body region coupled to the data line and having a length in a direction between the substrate and the data line, first gates located along the length of the first body region, and a first material between the first body region and the first gates, wherein at least a portion of the first material is configured to store information; and a second body region coupled to the data line and having a length in the direction between the substrate and the data line, second gates located along the length of the second body region, and a second material between the second body region and the second gate, and no portion of the second material is configured to store information.

10. The apparatus of claim 9, wherein the second body region is configured to selectively form at least a portion of a conductive path between separate segments of the data line during an operation of the apparatus.

11. The apparatus of claim 10, wherein the conductive path includes a U-shaped conductive path.

12. The apparatus of claim 9, further comprising:

a third body region coupled to the data line, the third body region having a length in the direction between the substrate and the data line;

third gates located along the length of the third body region; and a third material between the third body region and the third gates, wherein and no portion of the third material is configured to store information.

13. The apparatus of claim 12, further comprising a conductive line coupled between the second and third body regions, wherein each of the data line and the conductive line has a length in a same direction.

14. The apparatus of claim 12, further comprising:

a fourth body region coupled to the third body region, the fourth body region having a length in the direction between the substrate and the data line, and fourth gates being located along the length of the fourth body region; and a conductive line coupled to the fourth body region, wherein the conductive line has a length in a first direction, the data line has a length in a second direction, and the second direction is substantially perpendicular to the first direction.

15. An apparatus comprising:

a first device level and a second device level;

a memory cell string including a first memory cell located at the first device level and a second memory cell located at the second device level;

a conductive line configured to exchange information with the memory cell string; and a switching circuit configured to selectively exchange the information with a node, the circuit including a number of gates, the gates including a first gate located at the first device level and a second gate located at the second device level.

16. The apparatus of claim 15, wherein the first gate is coupled to the second gate.

17. The apparatus of claim 15, further comprising a third device level, wherein the circuit includes a third gate located at the third device level.

18. The apparatus of claim 15, wherein the memory cell string includes a number of gates equal to the number of gates of the circuit.

19. The apparatus of claim 15, wherein the memory cell and the switching circuit are formed from a same memory array.

20. The apparatus of claim 19, further comprising a bias circuit, wherein the memory cell is formed from a memory array, and at least one of the switching circuit and the bias circuit is formed from the memory array.

21. The apparatus of claim 15, wherein the memory cell is formed from a memory array and the switching circuit are formed outside the memory array.

22. The apparatus of claim 15, wherein a first group of gates among the gates of switching circuit is configured to receive a first signal, and a second group of gates among the gates of switching circuit is configured to receive a second signal different from the first signal.

23. The apparatus of claim 15, wherein the switching circuit includes elements configured to operate as pass elements.

24. The apparatus of claim 23, wherein the switching circuit includes a transistor coupled to the elements, and the transistor and the elements are configured to receive a same signal.

25. The apparatus of claim 23, wherein the switching circuit includes a transistor coupled to the elements, the transistor is configured to receive a first signal, and the elements are configured to receive a second signal different from the first signal.

26. An apparatus comprising:

a data line including a first segment and a second segment separated from the first segment;

a memory cell string coupled to the first segment, the memory cell string including a first body region having a length and first gates located along the length of the first body region; and a switching circuit having a second body region coupled to the first segment and a third body region coupled to the second segment, a conductive line coupling the second body region to the third body region, and second gates located along a length of the first and second and third body regions.

27. The apparatus of claim 26, wherein the second body region, the third body region, and the conductive line are configured to selectively form a conductive path between the first and second segments during an operation of the apparatus.

28. The apparatus of claim 26, wherein the second body region, the third body region, and the conductive line comprise an identical material.

29. The apparatus of claim 28, wherein the identical material includes silicon.

30. The apparatus of claim 26, wherein the second gates are coupled together.

31. An apparatus comprising:
a first memory cell string including a first body region, first gates located along a length of the first body region, and a first material between the first gates and the first body region, wherein at least a portion of the first material is configured to store information;
a second memory cell string including a second body region, second gates located along a length of the second body region, and a second material between the gates and the second body region, wherein at least a portion of the second material is configured to store information;
a first data line coupled to the first memory cell string;
a second data line coupled to the second memory cell string; and
a selector configured to selectively couple one of the first and second data lines to a node, the selector including a third body region, third gates located along a length of the third body region, and a third material between the third gates and the third body region, wherein the third gates are coupled together.

32. An apparatus comprising:
a first memory cell string including a first body region, first gates located along a length of the first body region, and a first material between the first gates and the first body region, wherein at least a portion of the first material is configured to store information;
a second memory cell string including a second body region, second gates located along a length of the second body region, and a second material between the gates and the second body region, wherein at least a portion of the second material is configured to store information;
a first data line coupled to the first memory cell string;
a second data line coupled to the second memory cell string;
a selector configured to selectively couple one of the first and second data lines to a node, the selector including a third body region, third gates located along a length of the third body region, and a third material between the third gates and the third body region;
a substrate and a sense circuit formed in the substrate, wherein the selector includes at least one transistor overlying the substrate; and an additional transistor coupled between the selector and the sense circuit, wherein the additional transistor is configured to operate at a voltage higher than a supply voltage of the apparatus.

33. An apparatus comprising:
a substrate;
a node;
a sense circuit coupled to the node, the sense circuit including at least a portion formed in the substrate;
data lines coupled to the node; and
a memory array formed over the substrate, the memory array including first portion and a second portion, the first portion including memory cell strings coupled to the data lines, the second portion including a selector configured to selectively couple the data lines to the node, wherein the memory array further includes a third portion included in the selector, the third portion includes a bias circuit configured to selectively couple the data lines to a reference voltage.

34. The apparatus of claim 33, wherein each of the selector and the memory cell strings includes a body region coupled to one of the data lines, and the body region has a length in a direction between the substrate and the data lines.

35. A method comprising:
applying a same voltage to all gates of a circuit of an apparatus in a first operation of the apparatus, the circuit coupled between a first segment of a data line and a second segment of the data line of the apparatus, the first segment coupled to a memory cell string, the memory cell string including a first memory cell located at a first device level of the device and a second memory cell located at a second device level of the apparatus; and
applying the same voltage to each of the gates of the circuit in a second operation of the apparatus.

36. The method of claim 35, wherein the first operation includes a read operation.

37. The method of claim 36, wherein the second operation includes a write operation.

38. The method of claim 37, further comprising:
applying a first voltage to a first group of gates among the gates in a third operation; and
applying a second voltage to a second group of gates among the gates in the third operation, wherein the first and second voltages have different values.

39. The method of claim 38, wherein the third operation includes an initialization operation.

40. The method of claim 37, further comprising:
applying another voltage to each of the gates in a third operation of the apparatus.

41. The method of claim 40, wherein the third operation includes an erase operation.

42. The method of claim 35, wherein the voltage includes zero volts.

43. The method of claim 35, wherein the voltage has a positive value.

44. The method of claim 35, further comprising:
coupling the first segment to a first voltage if a value of the voltage applied to the gates is zero volts in the first operation.

45. The method of claim 44, further comprising:
coupling the first segment to a second voltage if the voltage applied to the gates is zero volts in the second operation.

46. The method of claim 45, wherein the first operation includes a read operation, and the second voltage has a value greater than a value of the first voltage.

* * * * *

UNITED STATES PATENT AND TRADEMARK OFFICE
CERTIFICATE OF CORRECTION

PATENT NO.         : 8,619,471 B2                                              Page 1 of 1
APPLICATION NO.    : 13/192280
DATED              : December 31, 2013
INVENTOR(S)        : Toru Tanzawa It is certified that error appears in the above-identified patent and that said Letters Patent is hereby corrected as shown below:

In the Claims:

In column 28, line 50, in Claim 1, delete "wherein" and insert -- , wherein --, therefor.

In column 29, line 66, in Claim 12, before "no" delete "and".

In column 31, line 9, in Claim 26, after "the" delete "first and".

In column 32, line 12, in Claim 33, after "including" insert -- a --.

Signed and Sealed this
Fifteenth Day of April, 2014

Michelle K. Lee
*Deputy Director of the United States Patent and Trademark Office*